(12) United States Patent
Tsai

(10) Patent No.: US 11,758,712 B1
(45) Date of Patent: Sep. 12, 2023

(54) MANUFACTURING METHOD OF MEMORY DEVICE HAVING BIT LINE WITH STEPPED PROFILE

(71) Applicant: NANYA TECHNOLOGY CORPORATION, New Taipei (TW)

(72) Inventor: Tzu-Ching Tsai, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/730,065

(22) Filed: Apr. 26, 2022

(51) Int. Cl.
*H10B 12/00* (2023.01)

(52) U.S. Cl.
CPC .................. *H10B 12/482* (2023.02)

(58) Field of Classification Search
CPC .................................................. H10B 12/482
USPC .......................................................... 438/262
See application file for complete search history.

(56) References Cited

U.S. PATENT DOCUMENTS

2017/0098655 A1    4/2017  Costa et al.
2021/0066304 A1*   3/2021  Kang ................. H10B 12/0335

FOREIGN PATENT DOCUMENTS

TW        1750059 B      12/2021
TW      202211388 A       3/2022

OTHER PUBLICATIONS

Taiwanese Office Action dated Feb. 8, 2023 in application No. 111123257 and the search report attached to the Office Action; pp. 1-5.

* cited by examiner

*Primary Examiner* — Hoai V Pham
(74) *Attorney, Agent, or Firm* — Muncy, Geissler, Olds & Lowe, P.C.

(57) ABSTRACT

A method for preparing a semiconductor structure includes providing a semiconductor substrate having a first surface; disposing a first dielectric layer over the first surface of the semiconductor substrate, a conductive layer over the first dielectric layer, and a second dielectric layer over the conductive layer; disposing a patterned mask over the second dielectric layer; removing portions of the second dielectric layer, the conductive layer and the first dielectric layer exposed through the patterned mask to form a first trench; forming a spacer surrounding the first dielectric layer, the conductive layer and the second dielectric layer; disposing an energy-decomposable mask over the second dielectric layer and the spacer; irradiating a portion of the energy-decomposable mask by an electromagnetic radiation; removing the portion of the energy-decomposable mask irradiated by the electromagnetic radiation; and removing a portion of the second dielectric layer exposed through the energy-decomposable mask.

19 Claims, 26 Drawing Sheets

MANUFACTURING METHOD OF MEMORY DEVICE HAVING BIT LINE WITH STEPPED PROFILE

TECHNICAL FIELD

The present disclosure relates to a manufacturing method of a memory device and, and more particularly, to a manufacturing method of a memory device having a bit line (BL) with a stepped profile.

DISCUSSION OF THE BACKGROUND

Semiconductor devices are essential for many modern applications. With the advancement of electronic technology, semiconductor devices are becoming smaller in size while providing greater functionality and comprising greater amounts of integrated circuitry. Due to the miniaturized scale of semiconductor devices, various types and dimensions of semiconductor devices performing different functions are integrated and packaged into a single module. Furthermore, numerous manufacturing operations are implemented for integration of various types of semiconductor devices.

However, the manufacturing and integration of semiconductor devices involve many complicated steps and operations. An increase in complexity of manufacturing and integration of the semiconductor device may cause deficiencies such as misalignment of interconnect structures, bridging, short circuiting, etc. Accordingly, there is a continuous need to improve the structure and the manufacturing process of semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory device. The memory device includes a semiconductor substrate including a first surface; a bit line disposed on the first surface of the semiconductor substrate, wherein the bit line includes a first dielectric layer, a conductive layer disposed over the first dielectric layer, a second dielectric layer disposed over the conductive layer, and a spacer surrounding the first dielectric layer, the conductive layer and the second dielectric layer, wherein the second dielectric layer includes a first portion surrounded by the spacer, and a second portion disposed over the first portion and exposed through the spacer, wherein a first width of the first portion is substantially greater than a second width of the second portion.

In some embodiments, the first width of the first portion is substantially consistent along a height of the second dielectric layer.

In some embodiments, the second width of the second portion is substantially consistent along a height of the second dielectric layer.

In some embodiments, a top surface of the first portion is substantially coplanar with a top surface of the spacer.

In some embodiments, a first height of the first portion is substantially greater than or equal to a second height of the second portion.

In some embodiments, the first dielectric layer and the second dielectric layer include a same material.

In some embodiments, the first dielectric layer and the second dielectric layer include nitride.

In some embodiments, the conductive layer includes tungsten (W).

In some embodiments, the spacer includes nitride and oxide.

In some embodiments, the spacer includes a first layer, a second layer and a third layer, wherein the second layer is disposed between the first layer and the third layer.

In some embodiments, the first layer contacts the first dielectric layer, the conductive layer and the second dielectric layer.

In some embodiments, the second layer and the third layer are isolated from the first dielectric layer, the conductive layer and the second dielectric layer.

In some embodiments, the first layer and the third layer include nitride.

In some embodiments, the second layer includes oxide.

In some embodiments, the second dielectric layer is partially surrounded by the spacer.

In some embodiments, the first dielectric layer and the conductive layer are entirely surrounded by the spacer.

Another aspect of the present disclosure provides a memory device. The memory device includes: a semiconductor substrate including a first surface; a first bit line and a second bit line disposed on the first surface of the semiconductor substrate and adjacent to each other, wherein the first bit line and the second bit line respectively include a first dielectric layer, a conductive layer disposed over the first dielectric layer, a second dielectric layer disposed over the conductive layer, and a spacer surrounding the first dielectric layer, the conductive layer and the second dielectric layer; and a gap disposed between the first bit line and the second bit line, wherein the gap has a first width and a second width substantially different from the first width.

In some embodiments, the first width is substantially less than the second width.

In some embodiments, the second width is disposed over the first width.

In some embodiments, the gap is tapered toward the first surface of the semiconductor substrate.

Another aspect of the present disclosure provides a method of manufacturing a memory device. The method includes steps of providing a semiconductor substrate having a first surface; disposing a first dielectric layer over the first surface of the semiconductor substrate, a conductive layer over the first dielectric layer, and a second dielectric layer over the conductive layer; disposing a patterned mask over the second dielectric layer; removing portions of the second dielectric layer, the conductive layer and the first dielectric layer exposed through the patterned mask to form a first trench; forming a spacer surrounding the first dielectric layer, the conductive layer and the second dielectric layer; disposing an energy-decomposable mask over the second dielectric layer and the spacer; irradiating a portion of the energy-decomposable mask by an electromagnetic radiation; removing the portion of the energy-decomposable mask irradiated by the electromagnetic radiation; and removing a portion of the second dielectric layer exposed through the energy-decomposable mask.

In some embodiments, the method further comprises removing a portion of the spacer exposed through the energy-decomposable mask.

In some embodiments, at least a portion of the second dielectric layer is exposed through the spacer.

In some embodiments, the removal of the portion of the second dielectric layer and the removal of the portion of the spacer are performed separately or simultaneously.

In some embodiments, the energy-decomposable mask is thermally decomposable, photonically decomposable or electron-beam (e-beam) decomposable.

In some embodiments, the energy-decomposable mask includes a cross-linking compound having a functional group or a double bonding.

In some embodiments, the energy-decomposable mask includes polymer, polyimide, resin or epoxy.

In some embodiments, the electromagnetic radiation is emitted laterally toward the portion of the energy-decomposable mask.

In some embodiments, the electromagnetic radiation is infrared (IR), ultraviolet (UV) or electron beam (e-beam).

In some embodiments, the first trench extends toward the first surface of the semiconductor substrate and is adjacent to the second dielectric layer, the conductive layer and the first dielectric layer.

In some embodiments, the portion of the energy-decomposable mask irradiated by the electromagnetic radiation is disposed at a periphery of the energy-decomposable mask.

In some embodiments, the portion of the energy-decomposable mask irradiated by the electromagnetic radiation is in contact with the spacer and the second dielectric layer.

In some embodiments, a width of the energy-decomposable mask after the removal of the portion of the energy-decomposable mask irradiated by the electromagnetic radiation is substantially less than a width of the second dielectric layer after the formation of the first trench.

In some embodiments, after the removal of the portion of the second dielectric layer exposed through the energy-decomposable mask, the second dielectric layer includes a first width and a second width over the first width and substantially less than the first width.

In some embodiments, the method further comprises removing the energy-decomposable mask over the second dielectric layer after the removal of the portion of the second dielectric layer exposed through the energy-decomposable mask.

In conclusion, because a portion of a second dielectric layer of a bit line is removed to form a stepped profile, a distance or a critical dimension between two adjacent bit lines can be increased and bridging of two adjacent bit lines can be prevented. More specifically, because the bit line has the stepped profile around a periphery of the bit line, a subsequent filling of a gap between two adjacent bit lines with conductive or insulating material can be performed more efficiently. The gap between two adjacent bit lines can be filled completely without formation of voids or while minimizing the formation of voids. Therefore, a performance of the memory device and a process of manufacturing the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
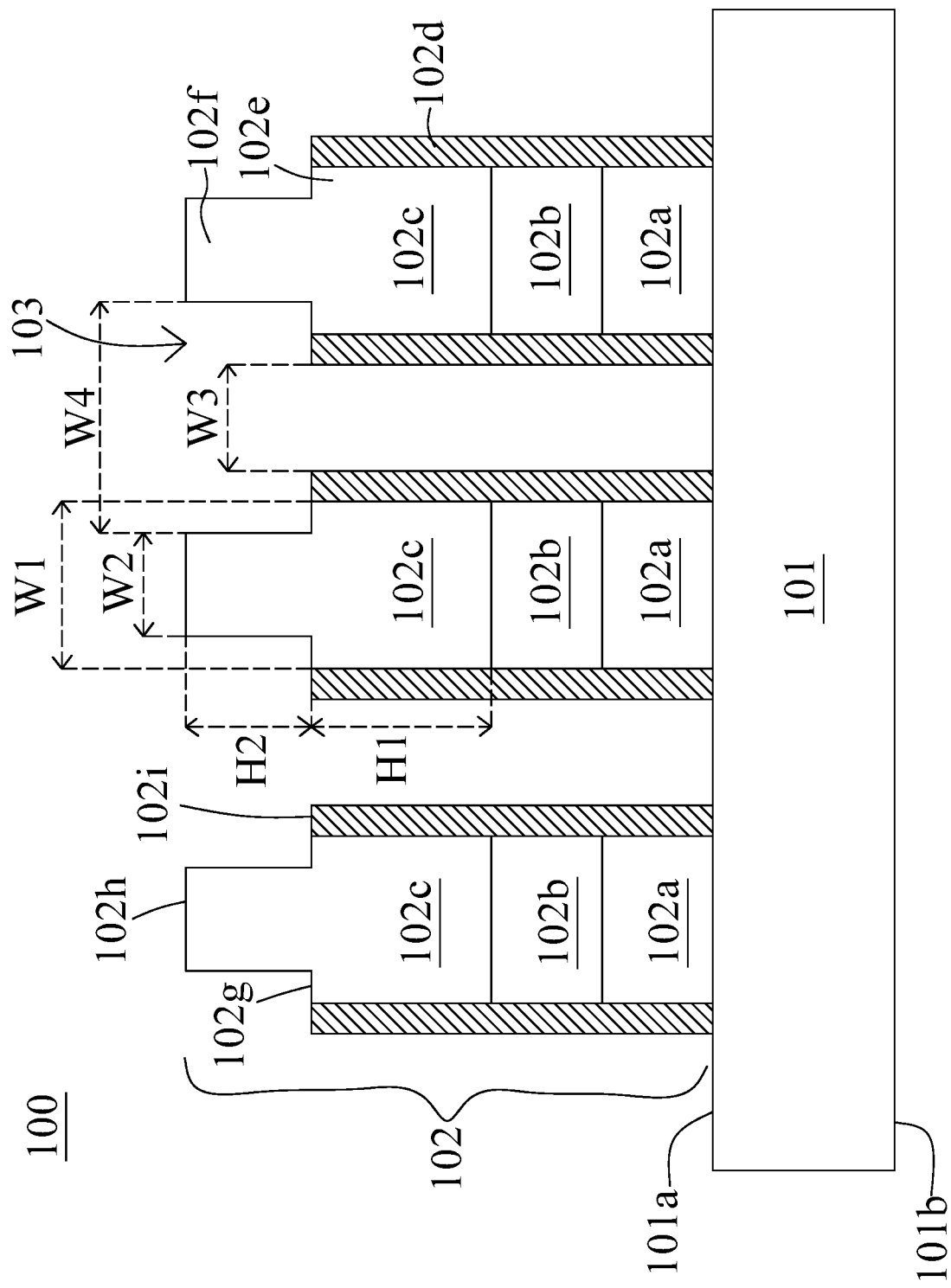
FIG. 1 is a cross-sectional side view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional side view of a memory device 100 in accordance with some embodiments of the present disclosure. In some embodiments, the memory device 100 includes several unit cells arranged in rows and columns.

In some embodiments, the memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes a first surface 101a and a second surface 101b opposite to the first surface 101b. In some embodiments, the first surface 101a is a front side of the semiconductor substrate 101, wherein electrical devices or components are subsequently formed over the first surface 101a and configured to electrically connect to an external circuitry. In some embodiments, the second surface 101b is a back side of the semiconductor substrate 101, where electrical devices or components are absent.

In some embodiments, the memory device 100 includes a bit line 102 disposed on the semiconductor substrate 101. In some embodiments, the bit line 102 is disposed on and extends from the first surface 101a of the semiconductor substrate 101. In some embodiments, the bit line 102 is configured to read a bit in the memory device 100 or allow an electrical current to program the bit. In some embodiments, the bit line 102 extends orthogonal to the first surface 101a of the semiconductor substrate 101.

In some embodiments, the bit line 102 includes a first dielectric layer 102a, a conductive layer 102b, a second dielectric layer 102c and a spacer 102d. In some embodiments, the first dielectric layer 102a is disposed on the first surface 101a of the semiconductor substrate 101. In some embodiments, the first dielectric layer 102a is entirely surrounded by the spacer 102d. In some embodiments, the first dielectric layer 102a includes dielectric material such as nitride or the like. In some embodiments, the first dielectric layer 102a includes silicon nitride.

In some embodiments, the conductive layer 102b is disposed over the first dielectric layer 102a. In some embodiments, the conductive layer 102b is in contact with the first dielectric layer 102a. In some embodiments, the conductive layer 102b is entirely surrounded by the spacer 102d. In some embodiments, the conductive layer 102b includes conductive material such as tungsten (W) or the like.

In some embodiments, the second dielectric layer 102c is disposed over the conductive layer 102b and the first dielectric layer 102a. In some embodiments, the second dielectric layer 102c is in contact with the conductive layer 102b and is separated from the first dielectric layer 102a by the conductive layer 102b. In some embodiments, the second dielectric layer 102c is partially surrounded by the spacer 102d.

In some embodiments, the second dielectric layer 102c includes dielectric material such as nitride or the like. In some embodiments, the second dielectric layer 102c includes silicon nitride. In some embodiments, the first dielectric layer 102a and the second dielectric layer 102c include a same material or different materials.

In some embodiments, the spacer 102d surrounds the first dielectric layer 102a, the conductive layer 102b and the second dielectric layer 102c. In some embodiments, the spacer 102d includes dielectric material such as oxide, nitride or the like. In some embodiments, the spacer 102d includes oxide and nitride. In some embodiments, the spacer 102d includes several layers. In some embodiments, the spacer 102d is a nitride-oxide-nitride (NON) structure.

Figure 2:
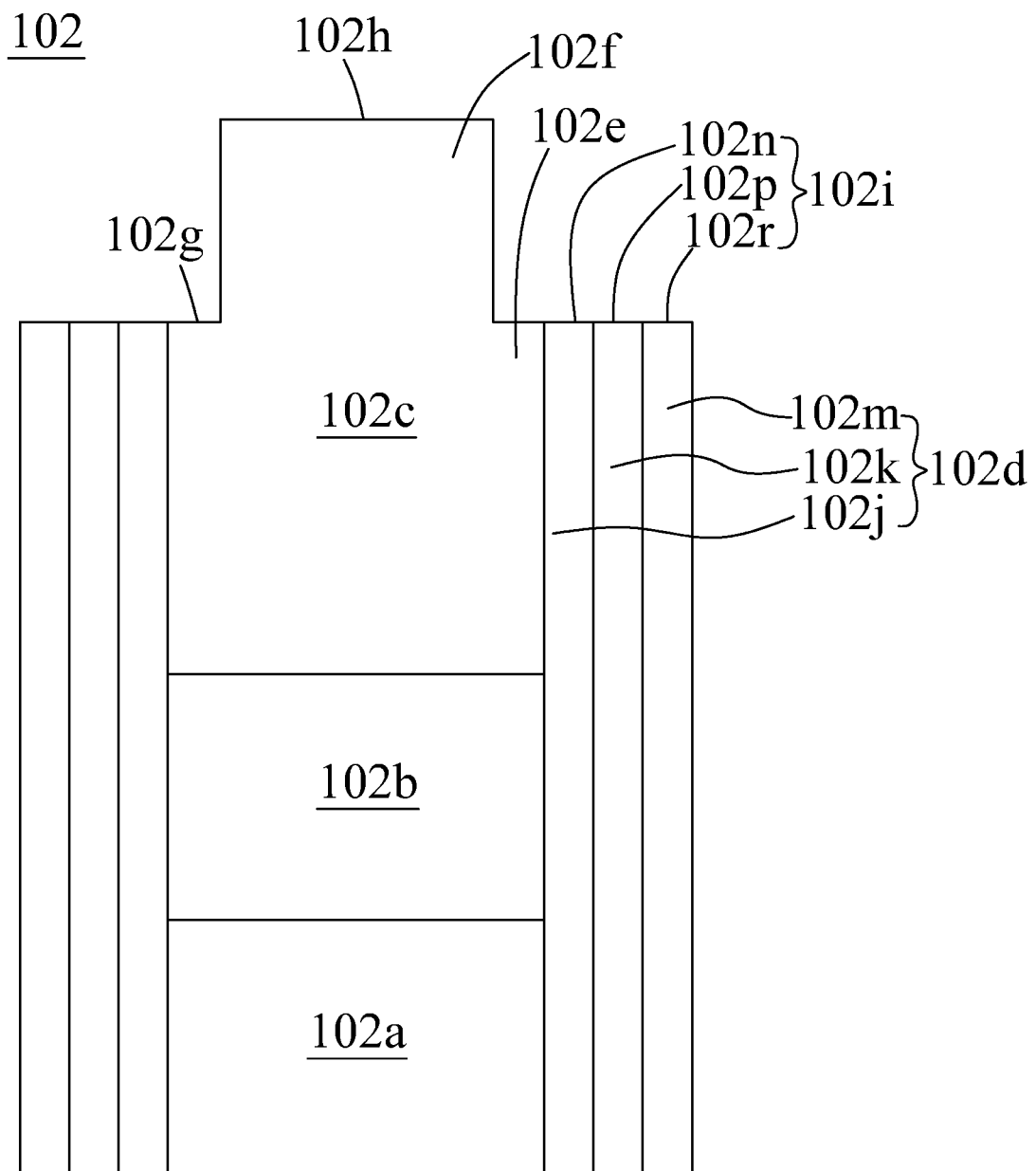
FIG. 2 is a cross-sectional enlarged side view of a bit line of the memory device in FIG. 1.

FIG. 2 is an enlarged view of the bit line 102 showing the spacer 102d having several layers. In some embodiments, the spacer 102d includes a first layer 102j, a second layer 102k and a third layer 102m. In some embodiments, the second layer 102k is disposed between the first layer 102j and the third layer 102m. In some embodiments, the first layer 102j is in contact with the second dielectric layer 102c, the conductive layer 102b and the first dielectric layer 102a. In some embodiments, the first layer 102j includes nitride or oxide. In some embodiments, the first layer 102j includes nitride.

In some embodiments, the second layer 102k is in contact with the first layer 102j and the third layer 102m. In some embodiments, the second layer 102k is isolated from the first dielectric layer 102a, the conductive layer 102b and the second dielectric layer 102c. In some embodiments, the second layer 102k includes nitride or oxide. In some embodiments, the second layer 102k includes oxide.

In some embodiments, the third layer 102m is in contact with the second layer 102k. In some embodiments, the third layer 102m is isolated from the first dielectric layer 102a, the conductive layer 102b and the second dielectric layer 102c. In some embodiments, the third layer 102m includes nitride or oxide. In some embodiments, the third layer 102m includes nitride.

Referring back to FIG. 1, the second dielectric layer 102c has a stepped profile. In some embodiments, the second dielectric layer 102c is at least partially exposed through the spacer 102d. In some embodiments, the second dielectric layer 102c includes a first portion 102e and a second portion 102f disposed over the first portion 102e. In some embodiments, the first portion 102e is surrounded by the spacer 102d. In some embodiments, the second portion 102f is exposed through the spacer 102d.

In some embodiments, the second portion 102f protrudes from the first portion 102e. In some embodiments, a first width W1 of the first portion 102e is substantially different from a second width W2 of the second portion 102f. In some embodiments, the first width W1 of the first portion 102e is substantially greater than the second width W2 of the second portion 102f.

In some embodiments, the first portion 102e has a first height H1, and the second portion 102f has a second height H2. In some embodiments, the first height H1 of the first portion 102e is substantially greater than or equal to the second height H2 of the second portion 102f. In some embodiments, the first width W1 of the first portion 102e is substantially consistent at positions of various distance above a bottom surface of the second dielectric layer 102c. In some embodiments, the second width W2 of the second portion 102f is substantially consistent at positions of various distance above a lower surface of the second portion 102f.

In some embodiments, the first portion 102e has a top surface 102g substantially coplanar with a top surface 102i of the spacer 102d. In some embodiments, the second portion 102f has a top surface 102h disposed higher than the top surface 102g of the first portion 102e and the top surface 102i of the spacer 102d. In some embodiments, the second portion 102f is separated from the spacer 102d.

Referring back to FIG. 2, the top surface 102i of the spacer 102d includes a top surface 102n of the first layer 102j, a top surface 102p of the second layer 102k and a top surface 102r of the third layer 102m. In some embodiments, the top surface 102g of the first portion 102e is substantially coplanar with the top surface 102n of the first layer 102j, the top surface 102p of the second layer 102k and the top surface 102r of the third layer 102m. In some embodiments, the top surface 102h of the second portion 102f is disposed higher than the top surface 102n of the first layer 102j, the top surface 102p of the second layer 102k and the top surface 102r of the third layer 102m.

Referring back to FIG. 1, a gap 103 is disposed between two adjacent bit lines 102. In some embodiments, at least a portion of the first surface 101a of the semiconductor substrate 101 is exposed through the gap 103. In some embodiments, the gap 103 is adjacent to the second portion 102f of the second dielectric layer 102c and adjacent to the spacer 102d. In some embodiments, the gap 103 is tapered toward the first surface 101a of the semiconductor substrate 101.

In some embodiments, the gap 103 has a third width W3 and a fourth width W4 substantially different from the third width W3. In some embodiments, the gap 103 has the fourth width W4 at a position higher than a position at which the gap 103 has the third width W3. In some embodiments, the third width W3 is substantially less than the fourth width W4.

The stepped profile of the second dielectric layer 102c of the bit line 102 causes the fourth width of the gap 103 between two adjacent bit lines 102 to be increased. As such, bridging of two adjacent bit lines 102 can be prevented, and a subsequent filling of the gap 103 between two adjacent bit lines 102 with conductive or insulating material can be performed more efficiently. The gap 103 can be filled completely without formation of voids or while minimizing the formation of voids. Therefore, performance of the memory device 100 is improved.

Figure 3:
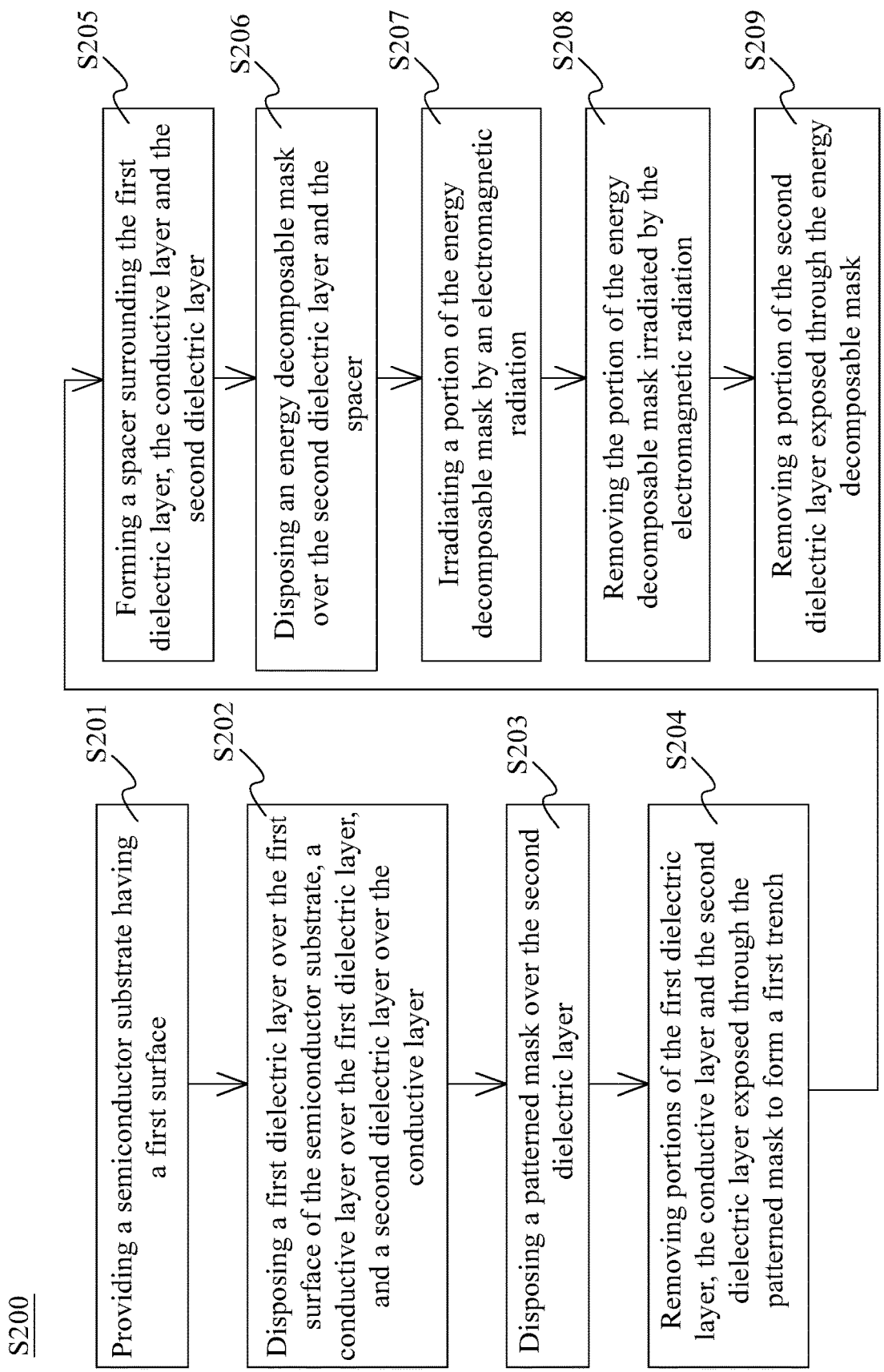
FIG. 3 is a flow diagram illustrating a method of manufacturing a memory device in accordance with some embodiments of the present disclosure.

FIG. 3 is a flow diagram illustrating a method S200 of manufacturing a memory device 100 in accordance with some embodiments of the present disclosure, and FIGS. 4 to 26 illustrate cross-sectional views of intermediate stages in formation of the memory device 100 in accordance with some embodiments of the present disclosure.

The stages shown in FIGS. 4 to 26 are also illustrated schematically in the flow diagram in FIG. 3. In following discussion, the fabrication stages shown in FIGS. 4 to 26 are discussed in reference to process steps shown in FIG. 3. The method S200 includes a number of operations, and description and illustration are not deemed as a limitation to a sequence of the operations. The method S200 includes a number of steps (S201, S202, S203, S204, S205, S206, S207, S208 and S209).

Figure 4:
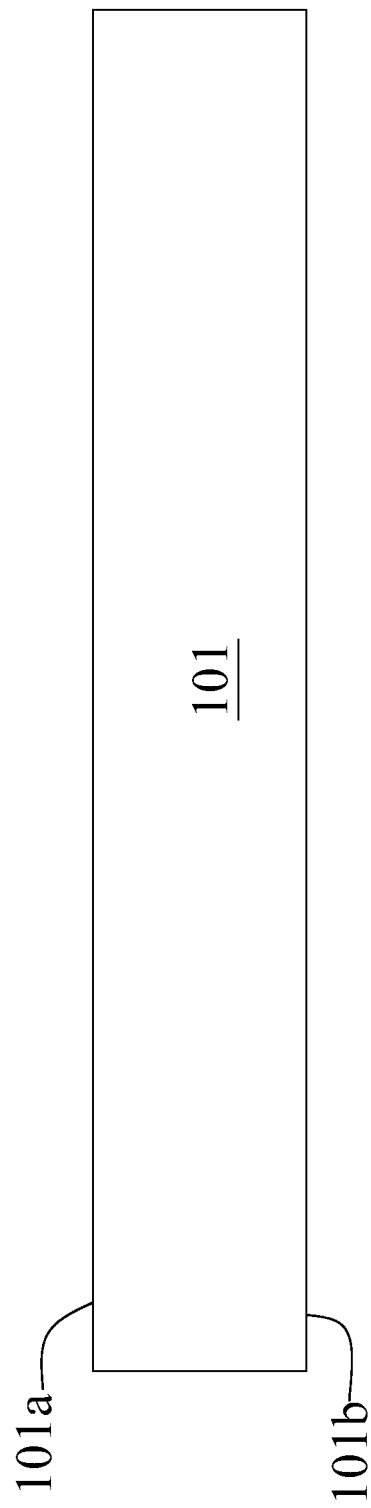
FIGS. 4 to 26 illustrate cross-sectional views of intermediate stages in the formation of a memory device in accordance with some embodiments of the present disclosure.

Referring to FIG. 4, a semiconductor substrate 101 is provided according to step S201 in FIG. 3. In some embodiments, the semiconductor substrate 101 includes semiconductive material such as silicon, germanium, gallium, arsenic, or a combination thereof. In some embodiments, the semiconductor substrate 101 is a silicon substrate. In some embodiments, the semiconductor substrate 101 has a first surface 101a and a second surface 101b opposite to the first surface 101a.

Figure 5:
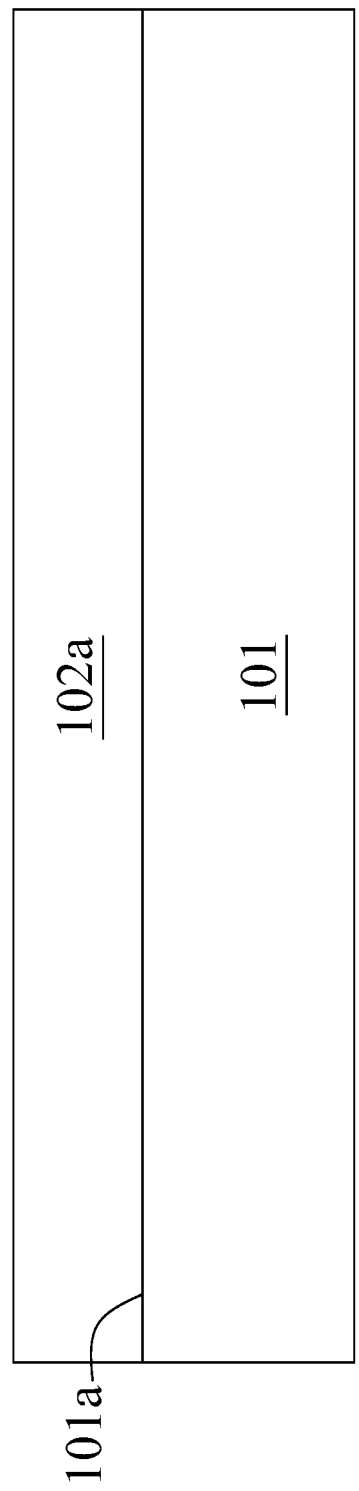
Figure 6:
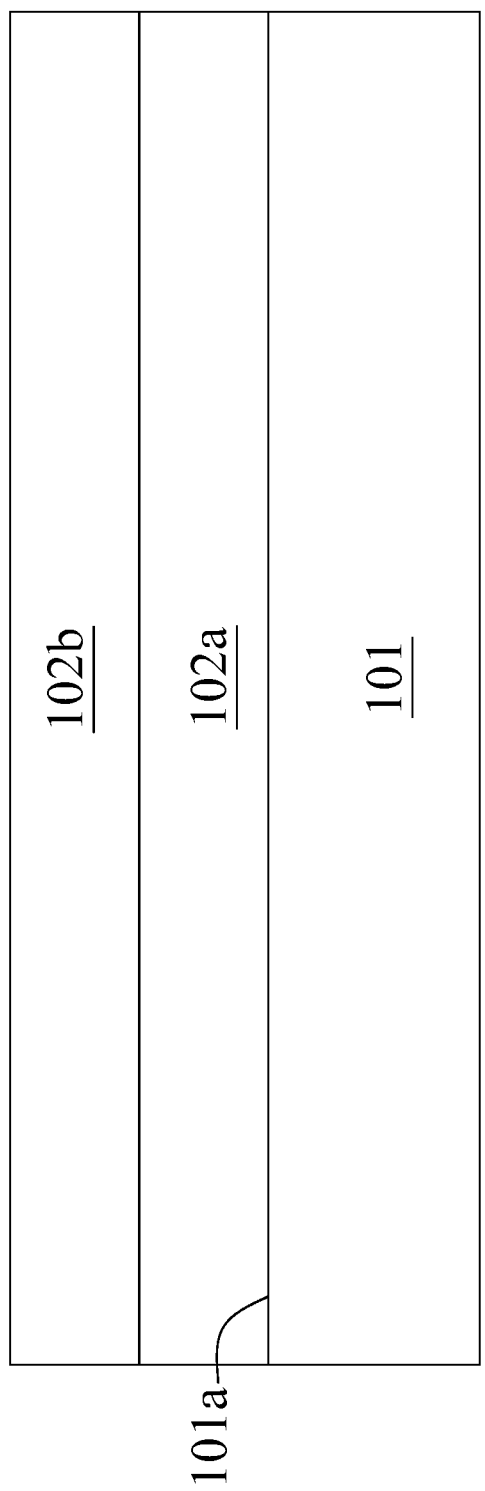
Figure 7:
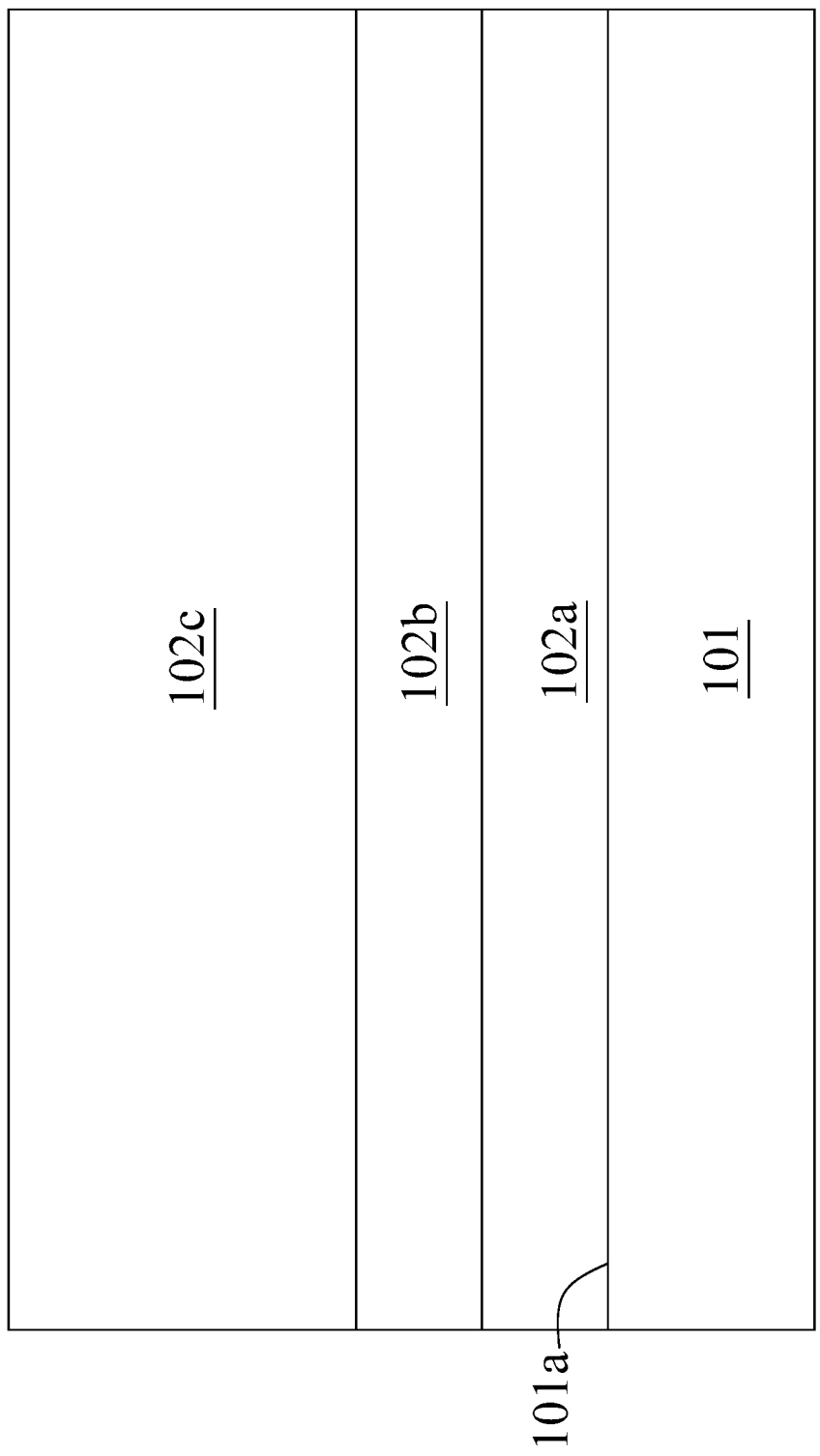

Referring to FIGS. 5 to 7, a first dielectric layer 102a, a conductive layer 102b and a second dielectric layer 102c are disposed according to step S202 in FIG. 3. In some embodiments as shown in FIG. 5, the first dielectric layer 102a is disposed over the first surface 101a of the semiconductor substrate 101. In some embodiments, the first dielectric layer 102a is disposed by deposition, chemical vapor deposition (CVD) or any other suitable process. In some embodiments, the first dielectric layer 102a includes dielectric material such as nitride or the like. In some embodiments, the first dielectric layer 102a includes silicon nitride.

In some embodiments as shown in FIG. 6, the conductive layer 102b is disposed over the first dielectric layer 102a. In some embodiments, the conductive layer 102b is disposed by deposition, chemical vapor deposition (CVD) or any other suitable process. In some embodiments, the conductive layer 102b includes conductive material such as tungsten (W) or the like.

In some embodiments as shown in FIG. 7, the second dielectric layer 102c is disposed over the conductive layer 102b. In some embodiments, the second dielectric layer 102c is disposed by deposition, chemical vapor deposition (CVD) or any other suitable process. In some embodiments, the second dielectric layer 102c includes dielectric material such as nitride or the like. In some embodiments, the second dielectric layer 102c includes silicon nitride. In some embodiments, the first dielectric layer 102a and the second dielectric layer 102c include a same material.

Figure 8:
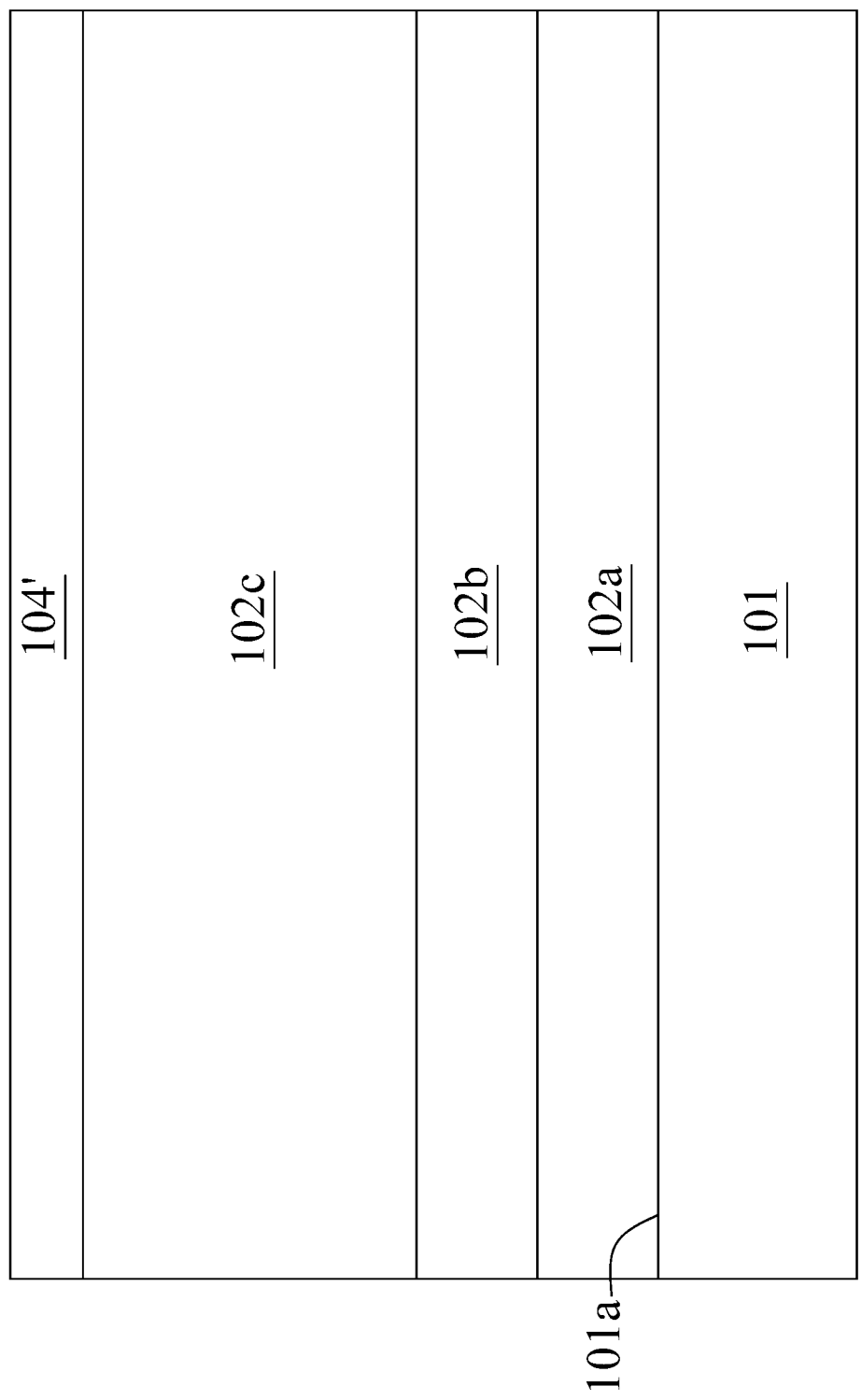
Figure 9:
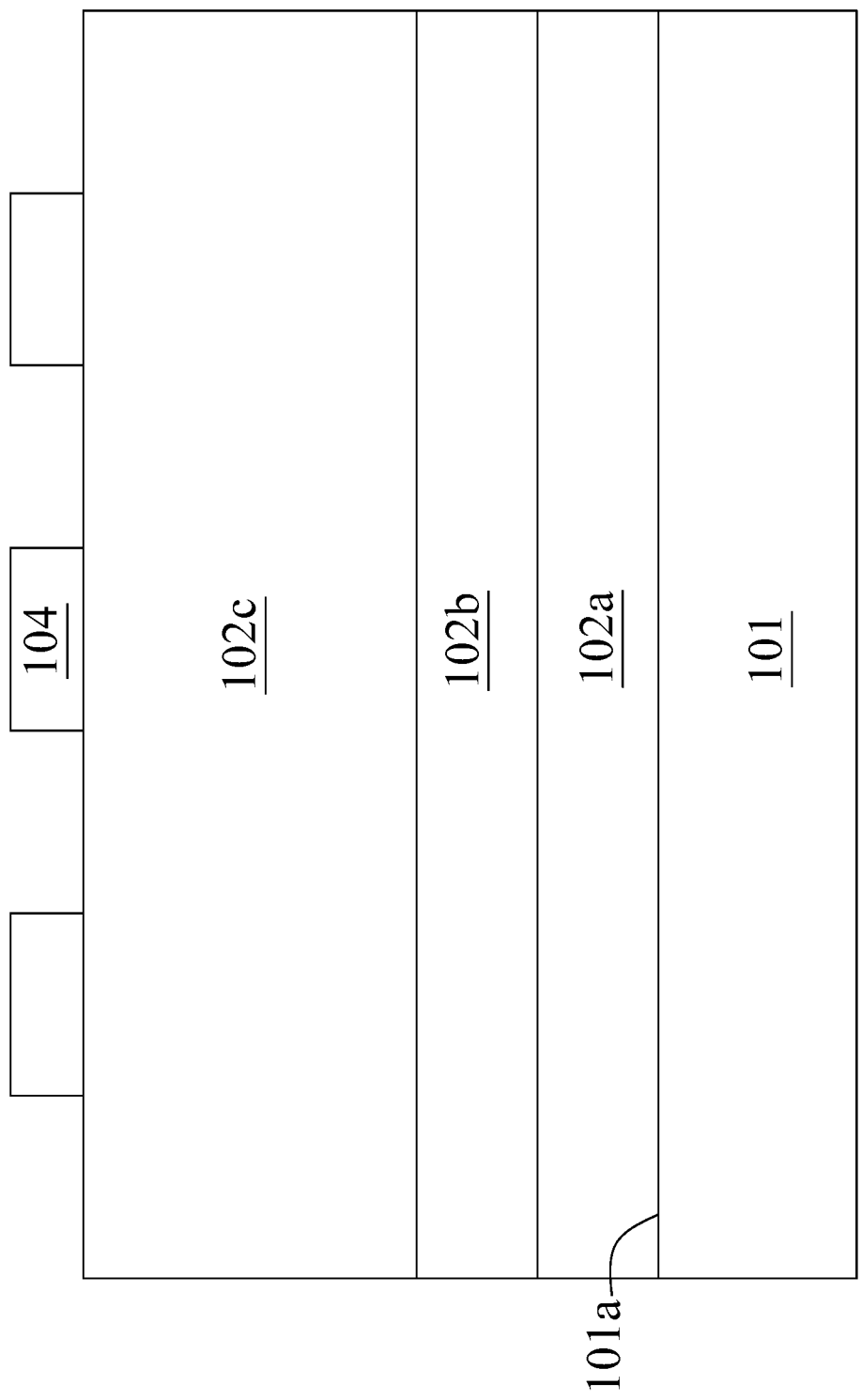

Referring to FIGS. 8 and 9, a patterned mask 104 is disposed over the second dielectric layer 102c according to step S203 in FIG. 3. In some embodiments, the disposing of the patterned mask 104 includes disposing a photoresist 104' over the second dielectric layer 102c as shown in FIG. 8, and then removing some portions of the photoresist 104' to form the patterned mask 104 as shown in FIG. 9.

In some embodiments, the photoresist 104' is disposed by spin coating or any other suitable process. In some embodiments, some portions of the photoresist 104' are removed by etching or any other suitable process. In some embodiments, at least a portion of the second dielectric layer 102c is exposed through the patterned mask 104 after the formation of the patterned mask 104 as shown in FIG. 9.

Figure 10:
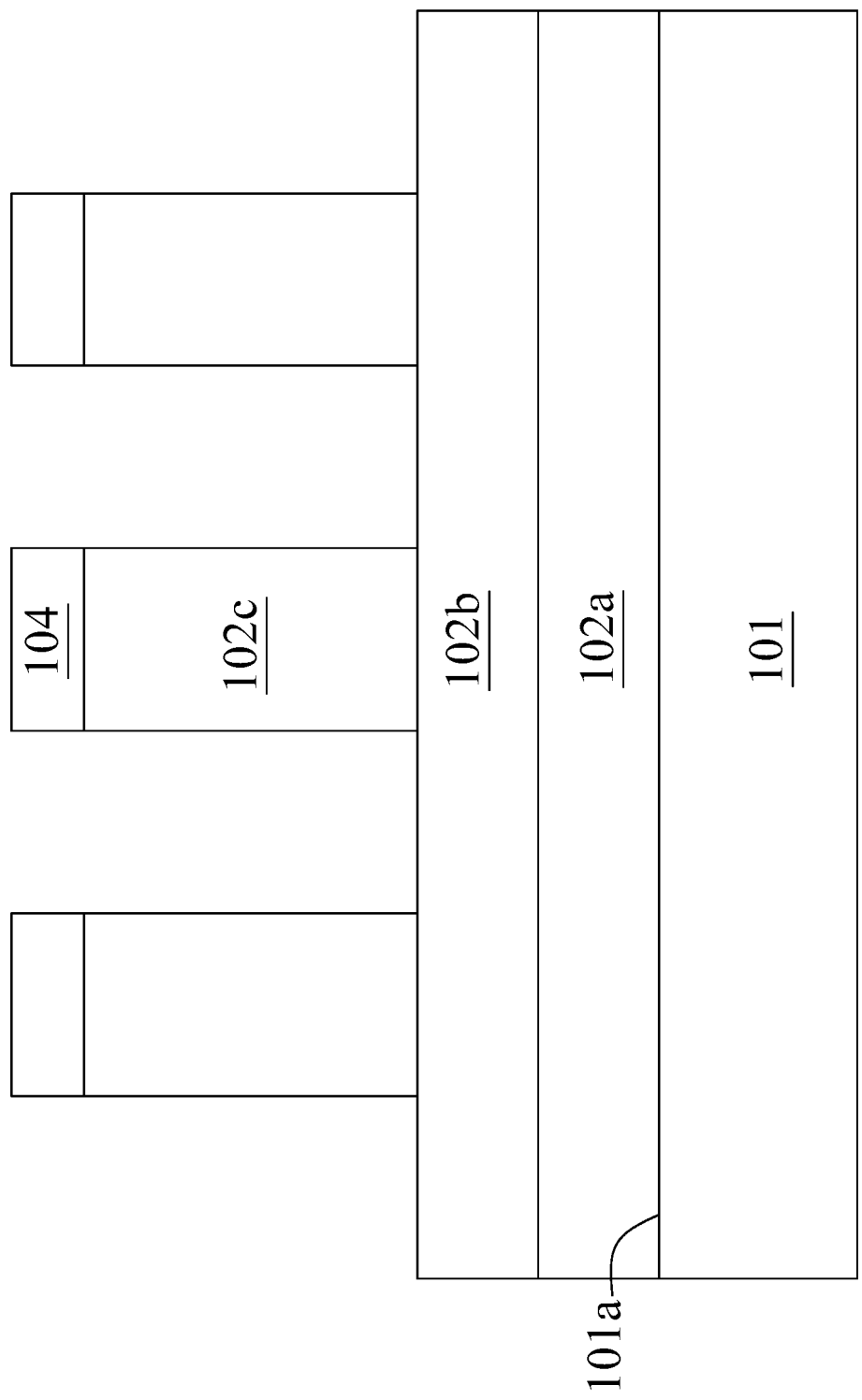
Figure 11:
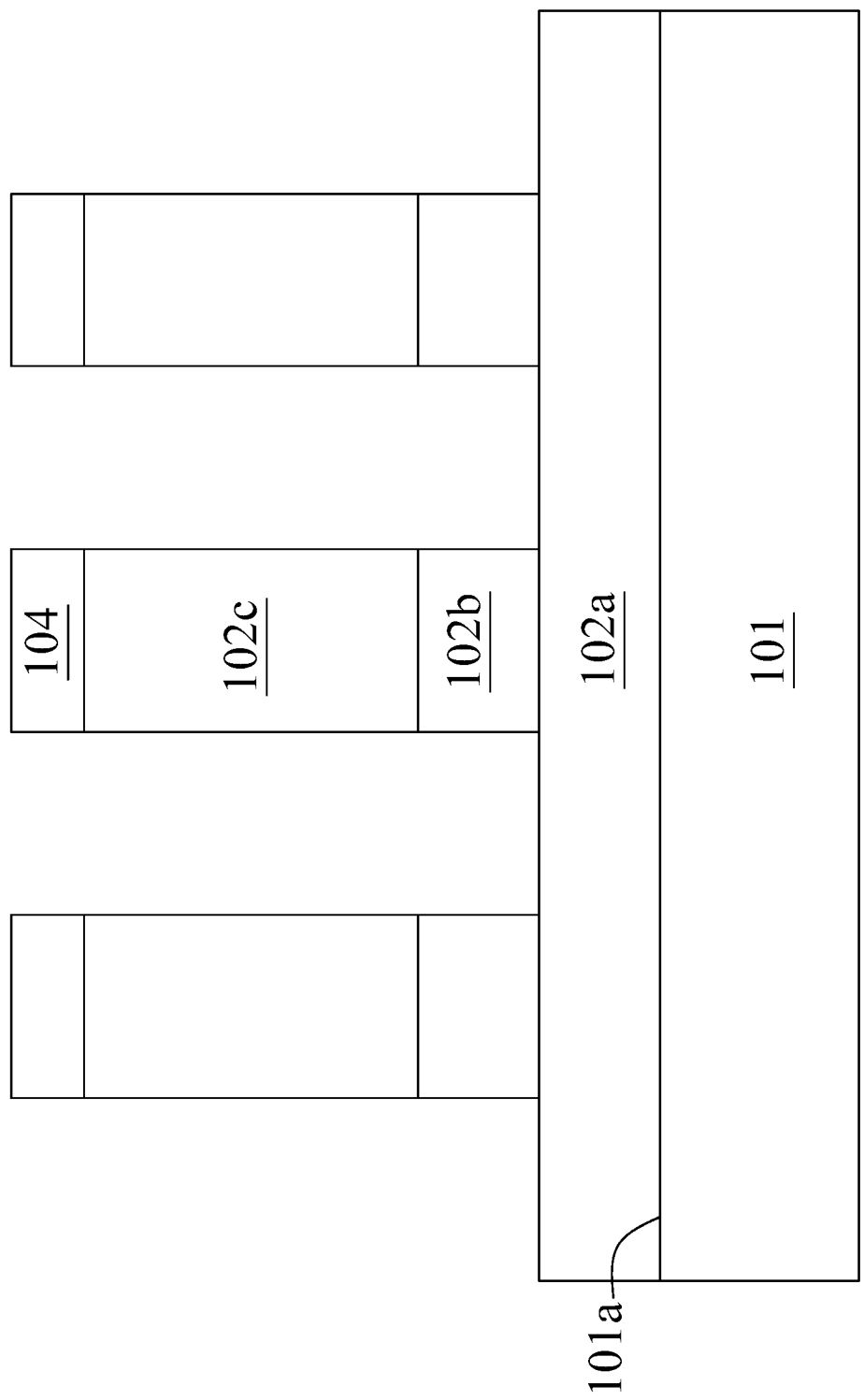
Figure 12:
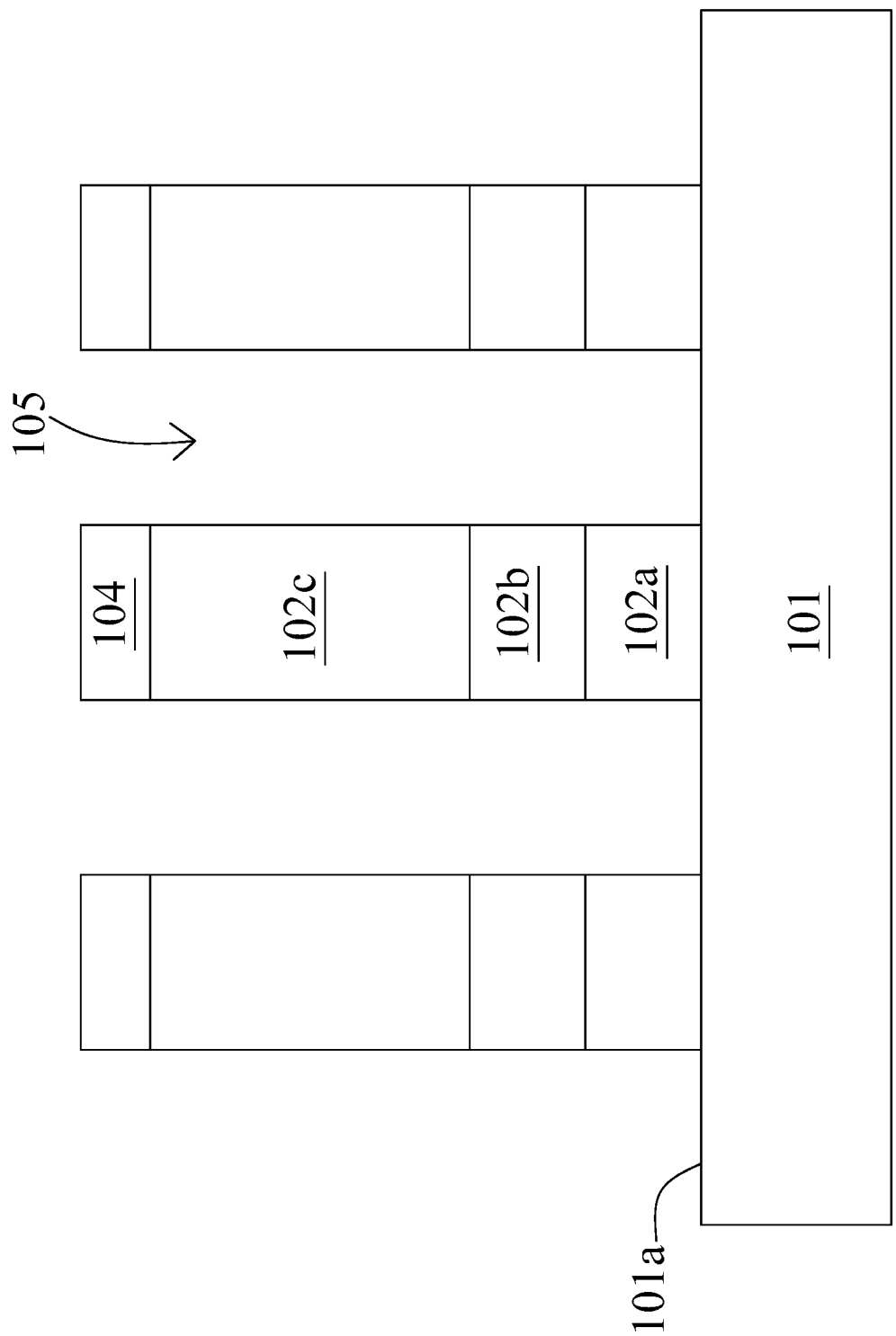

Referring to FIGS. 10 to 12, portions of the first dielectric layer 102a, the conductive layer 102b and the second dielectric layer 102c exposed through the patterned mask 104 are removed to form a first trench 105 according to step S204 in FIG. 3. In some embodiments, the first trench 105 extends toward the first surface 101a of the semiconductor substrate 101 and is adjacent to the second dielectric layer 102c, the conductive layer 102b and the first dielectric layer 102a.

In some embodiments, the formation of the trench 105 includes removing a portion of the second dielectric layer 102c as shown in FIG. 10, removing a portion of the conductive layer 102b as shown in FIG. 11, and removing a portion of the first dielectric layer 102a as shown in FIG. 12.

Figure 13:
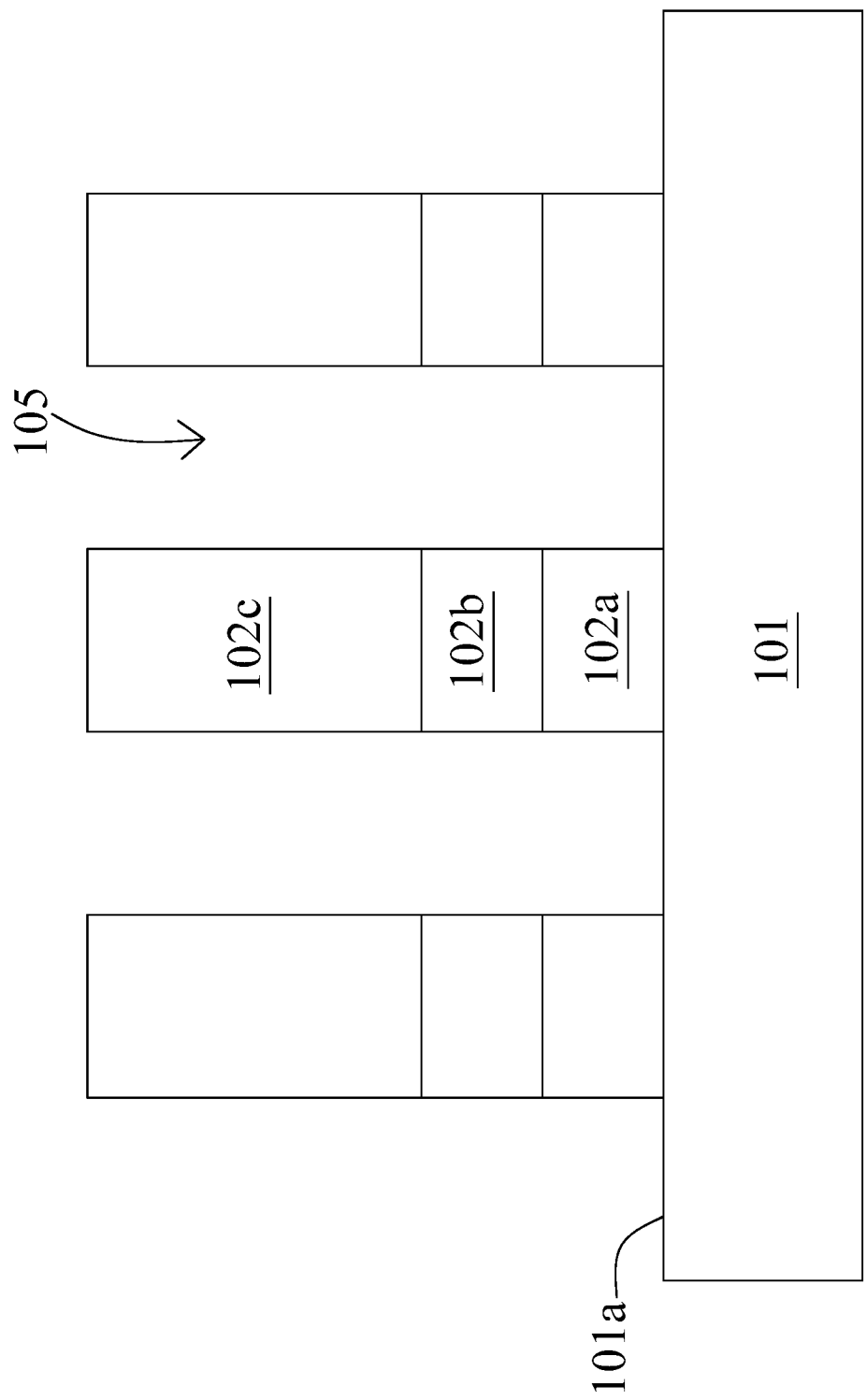

In some embodiments, the removal of the portion of the second dielectric layer 102c, the removal of the portion of the conductive layer 102b and the removal of the portion of the first dielectric layer 102a include etching or any other suitable process. In some embodiments, at least a portion of the first surface 101a of the semiconductor substrate 101 is exposed after the formation of the first trench 105 as shown in FIG. 12. In some embodiments as shown in FIG. 13, after the formation of the first trench 105, the patterned mask 104 is removed by etching, stripping or any other suitable process.

Figure 14:
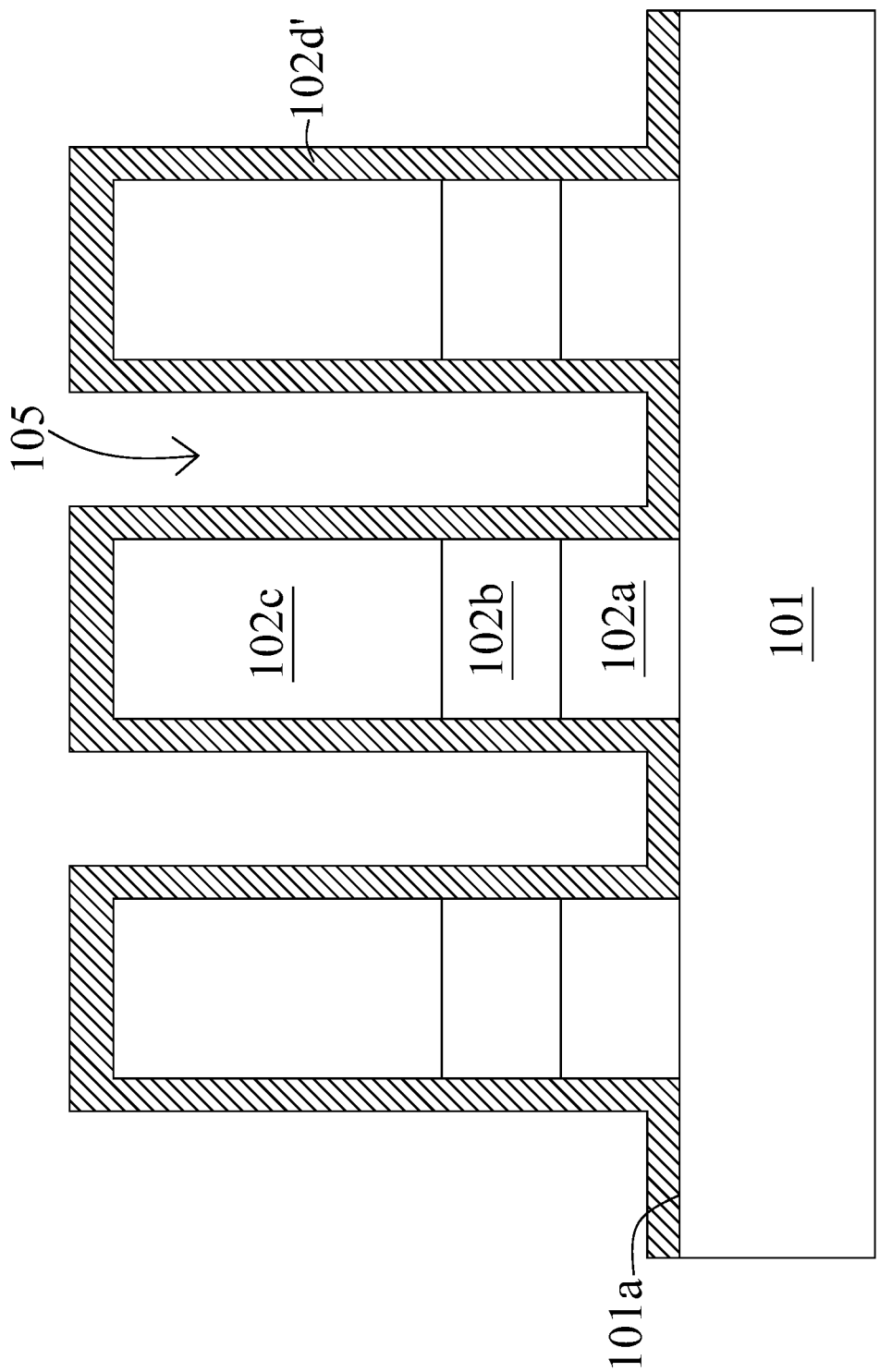
Figure 15:
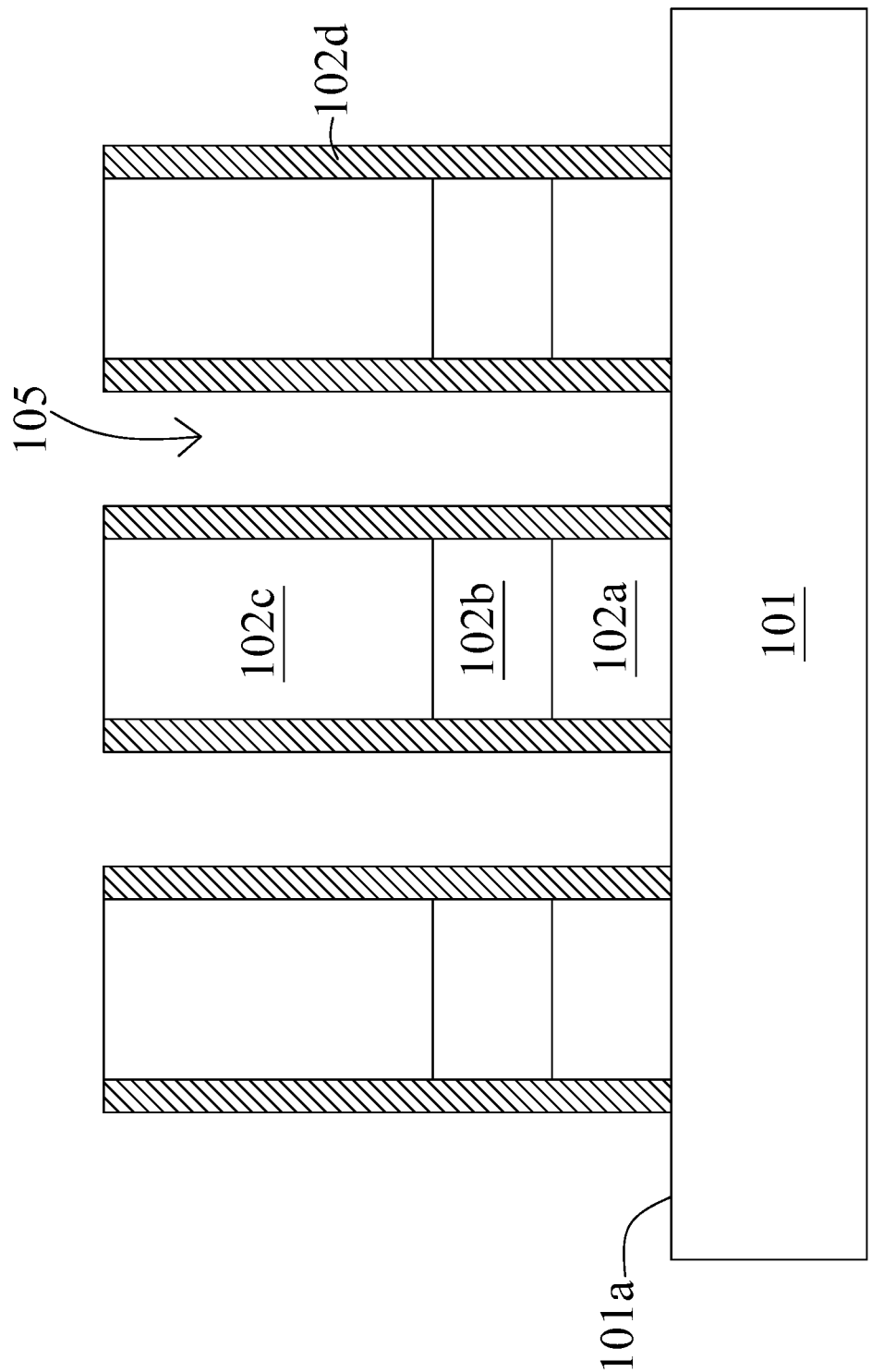

Referring to FIGS. 14 and 15, a spacer 102d surrounding the first dielectric layer 102a, the conductive layer 102b and the second dielectric layer 102c is formed according to step S205. In some embodiments, the spacer 102d is formed by disposing a spacer material 102d' over the semiconductor substrate 101 and the second dielectric layer 102c and conformal to the first trench 105 as shown in FIG. 14, and then removing portions of the spacer material 102d' disposed over the semiconductor substrate 101 and over the second dielectric layer 102c as shown in FIG. 15.

In some embodiments, the spacer material 102d' and the spacer 102d include nitride and oxide. In some embodiments, the spacer material 102d' is disposed by deposition, CVD or any other suitable process. In some embodiments, the portions of the spacer material 102d' disposed over the semiconductor substrate 101 and the second dielectric layer 102c are removed by etching or any other suitable process. In some embodiments, at least a portion of the first surface 101a of the semiconductor substrate 101 and at least a portion of the second dielectric layer 102c are exposed after the formation of the spacer 102d as shown in FIG. 15.

Figure 16:
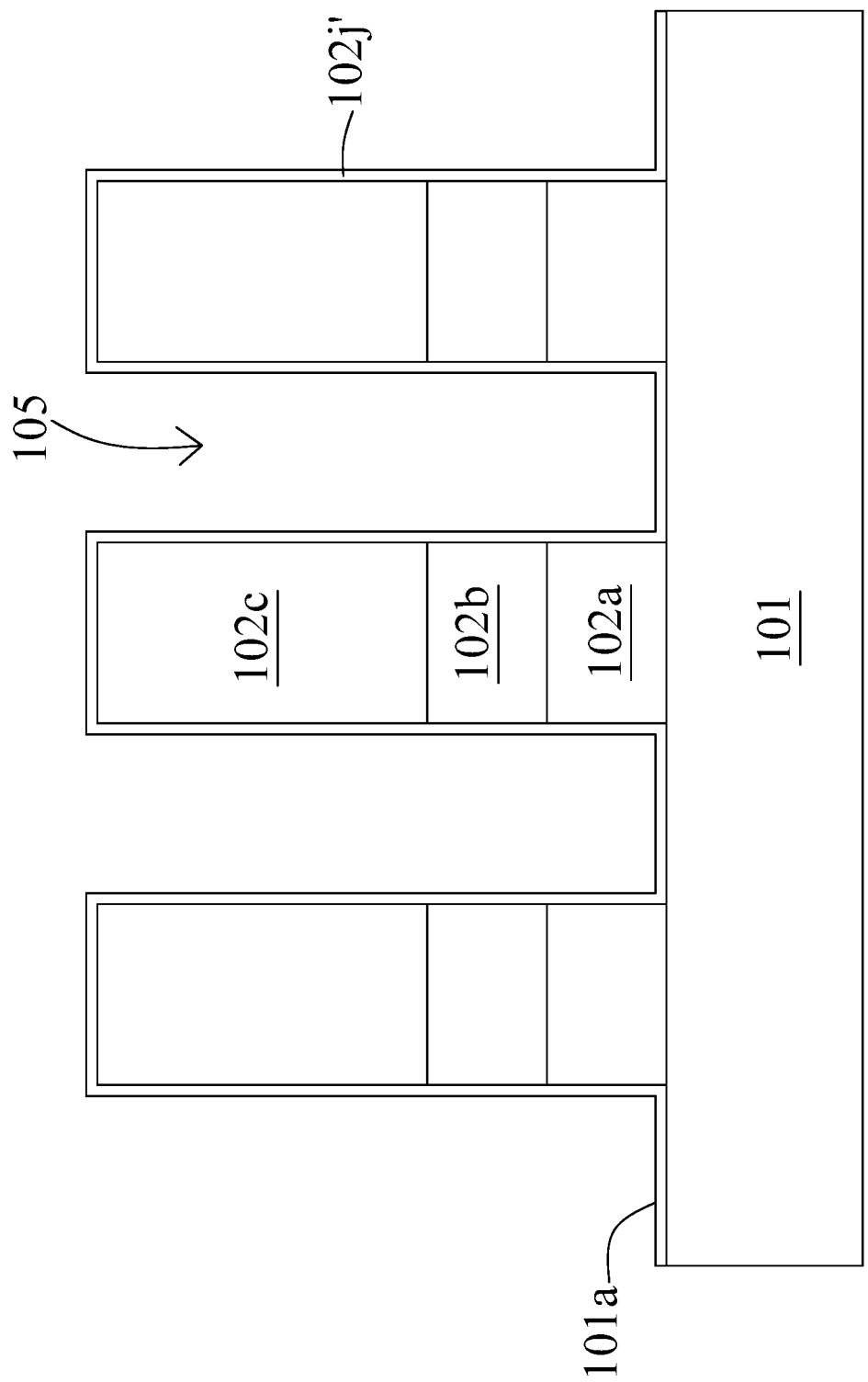
Figure 17:
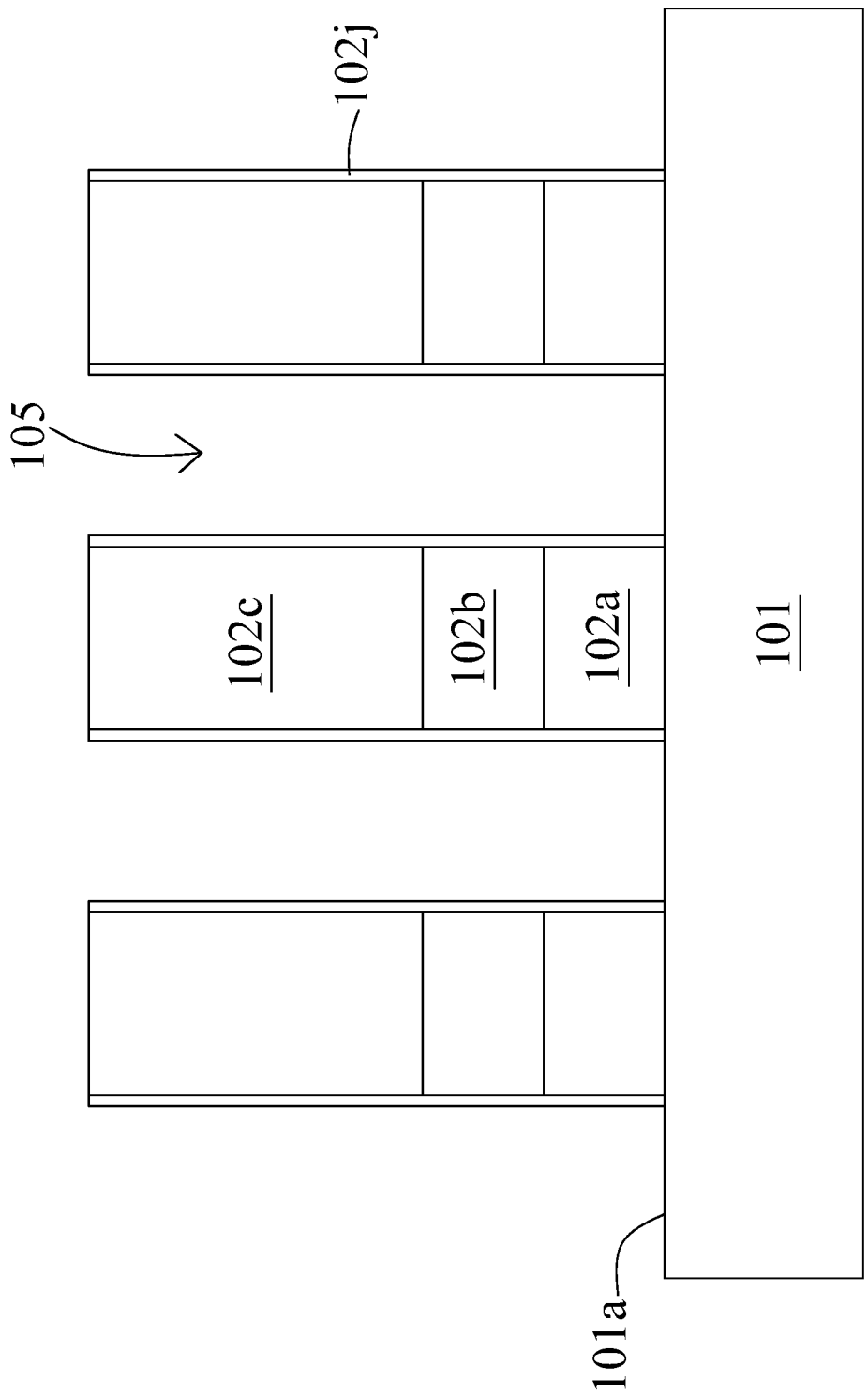
Figure 18:
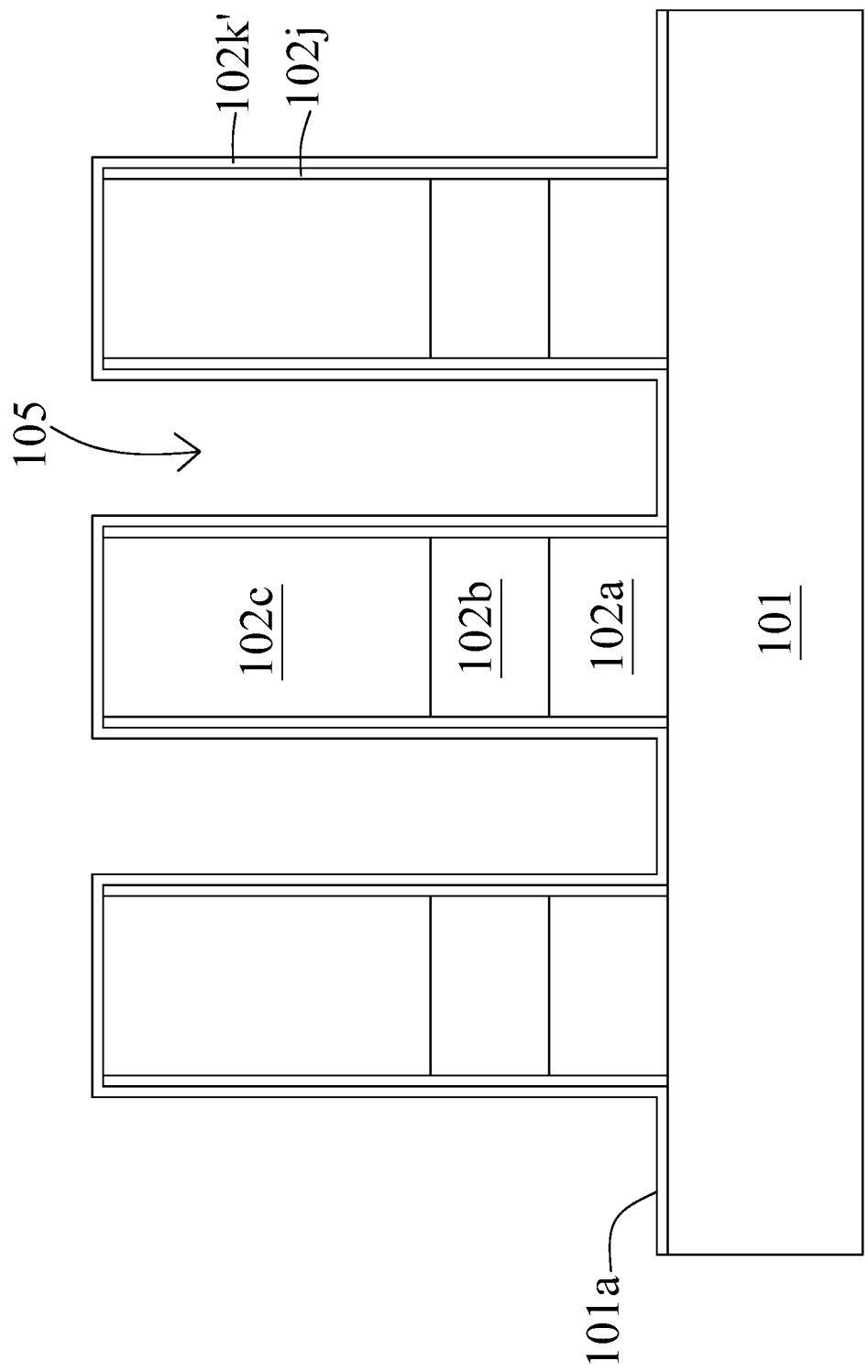
Figure 19:
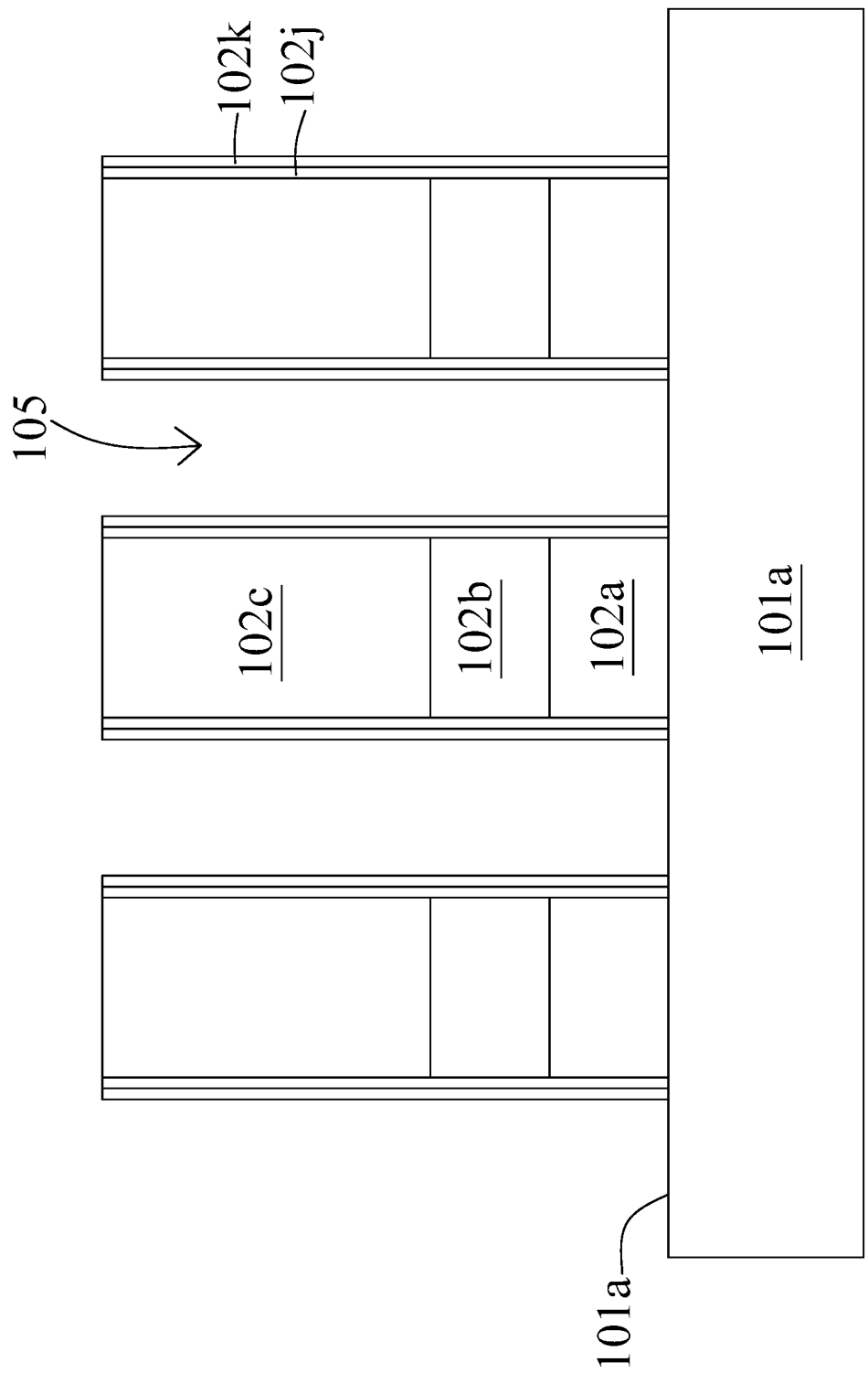
Figure 20:
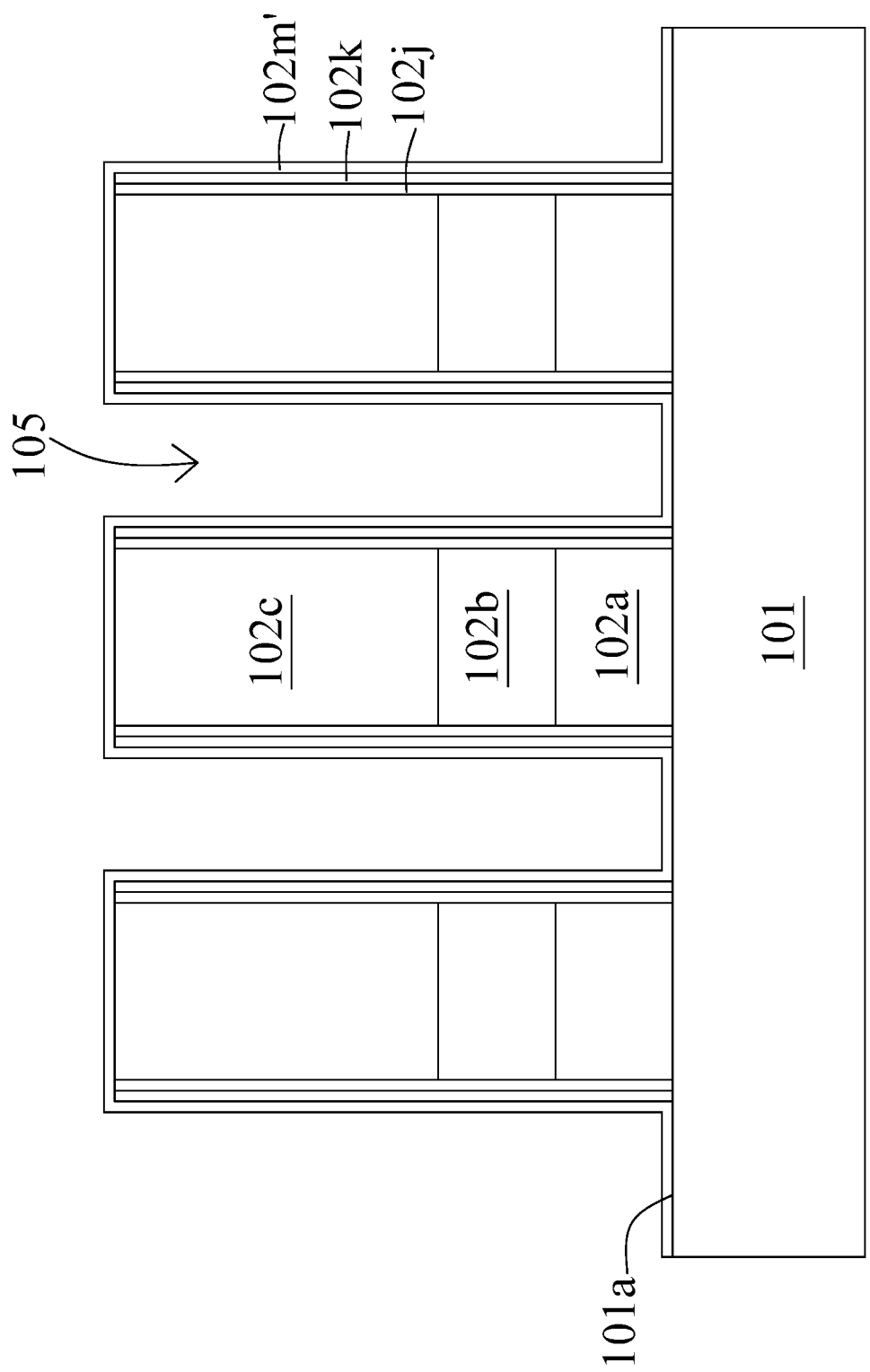
Figure 21:
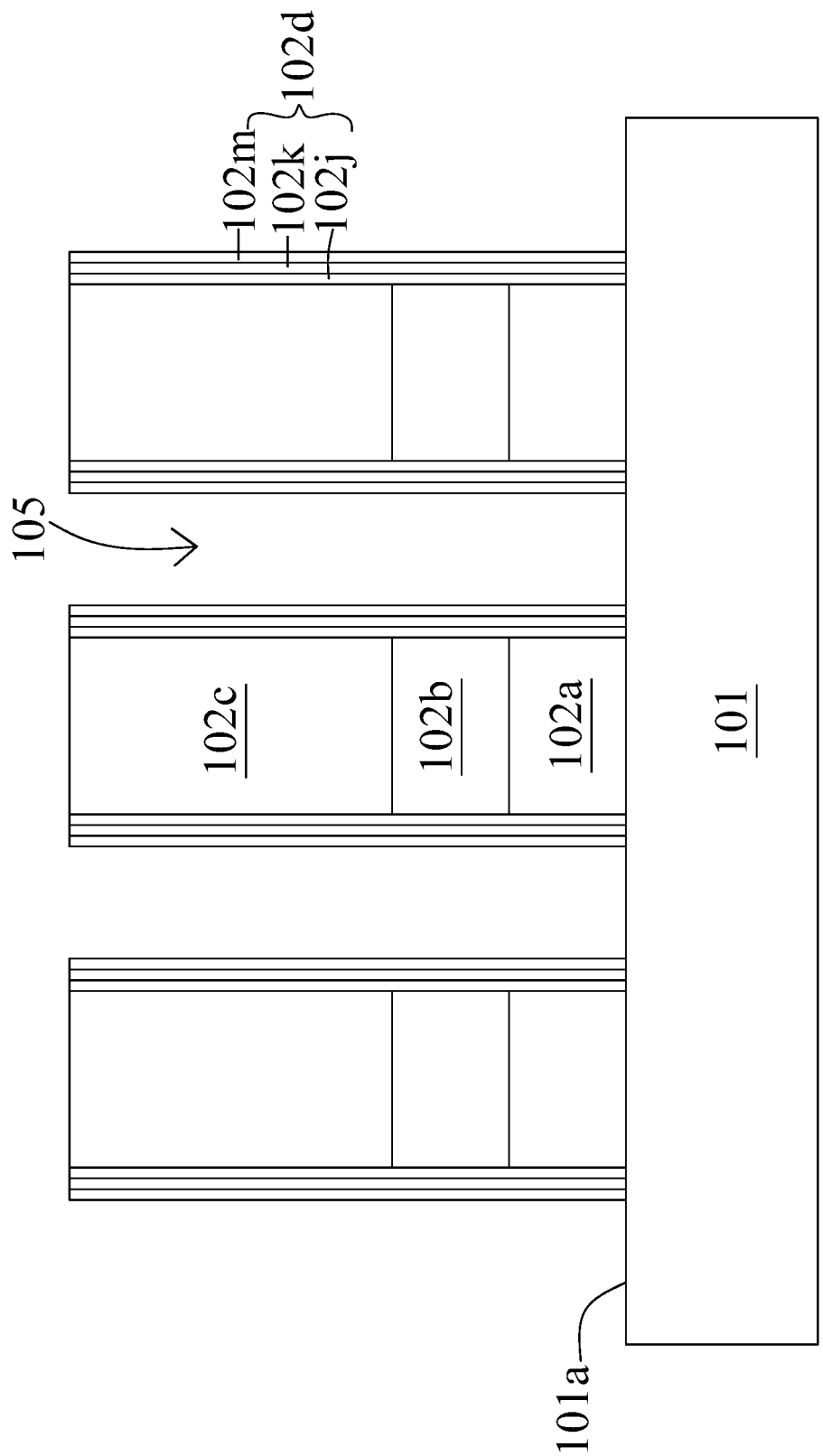

In some embodiments, the formation of the spacer 102d includes formation of a first layer 102j as shown in FIGS. 16 and 17, formation of a second layer 102k as shown in FIGS. 18 and 19, and formation of a third layer 102m as shown in FIGS. 20 and 21. In some embodiments, the first layer 102j is formed by disposing a first layer material 102j' over the semiconductor substrate 101 and conformal to the first trench 105 as shown in FIG. 16, and then removing some portions of the first layer material 102j over the semiconductor substrate 101 and over the second dielectric layer 102c to form the first layer 102j as shown in FIG. 17.

In some embodiments, the second layer 102k is formed by disposing a second layer material 102k' over the semiconductor substrate 101 and conformal to the first layer 102j as shown in FIG. 18, and then removing some portions of the second layer material 102k' over the semiconductor substrate 101 and over the second dielectric layer 102c to form the second layer 102k as shown in FIG. 19.

In some embodiments, the third layer 102m is formed by disposing a third layer material 102m' over the semiconductor substrate 101 and conformal to the second layer 102k as shown in FIG. 20, and then removing some portions of the third layer material 102m' over the semiconductor substrate 101 and over the second dielectric layer 102c to form the third layer 102m as shown in FIG. 21. In some embodiments, the spacer 102d including the first layer 102j, the second layer 102k and the third layer 102m is formed as shown in FIG. 21. In some embodiments, the first layer 102j and the third layer 102m include nitride, and the second layer 102k includes oxide.

Figure 22:
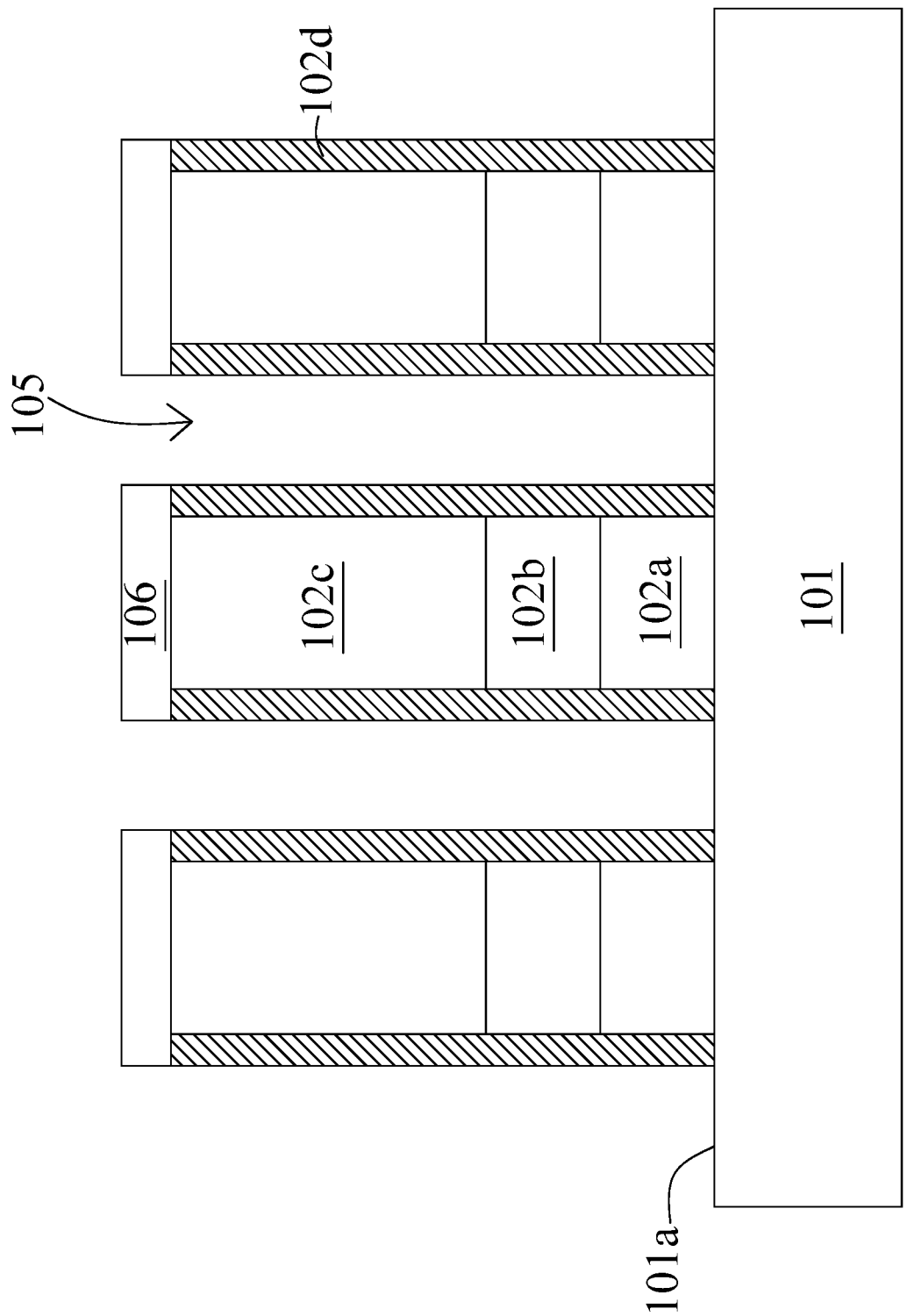

Referring to FIG. 22, an energy-decomposable mask 106 is disposed over the second dielectric layer 102c and the spacer 102d according to step S206 in FIG. 3. In some embodiments, the energy-decomposable mask 106 is disposed by deposition, CVD or any other suitable process. In some embodiments, the energy-decomposable mask 16 is thermally decomposable, photonically decomposable, electron-beam (e-beam) decomposable, or the like. In some embodiments, the energy-decomposable mask 106 can be decomposed by any suitable kind of energy such as heat, infrared (IR), ultraviolet (UV), e-beam or the like. In some embodiments, the energy-decomposable mask 106 includes a cross-linking compound having a functional group or a double bonding. In some embodiments, the energy-decomposable mask 106 includes polymer, polyimide, resin, epoxy or the like.

Figure 23:
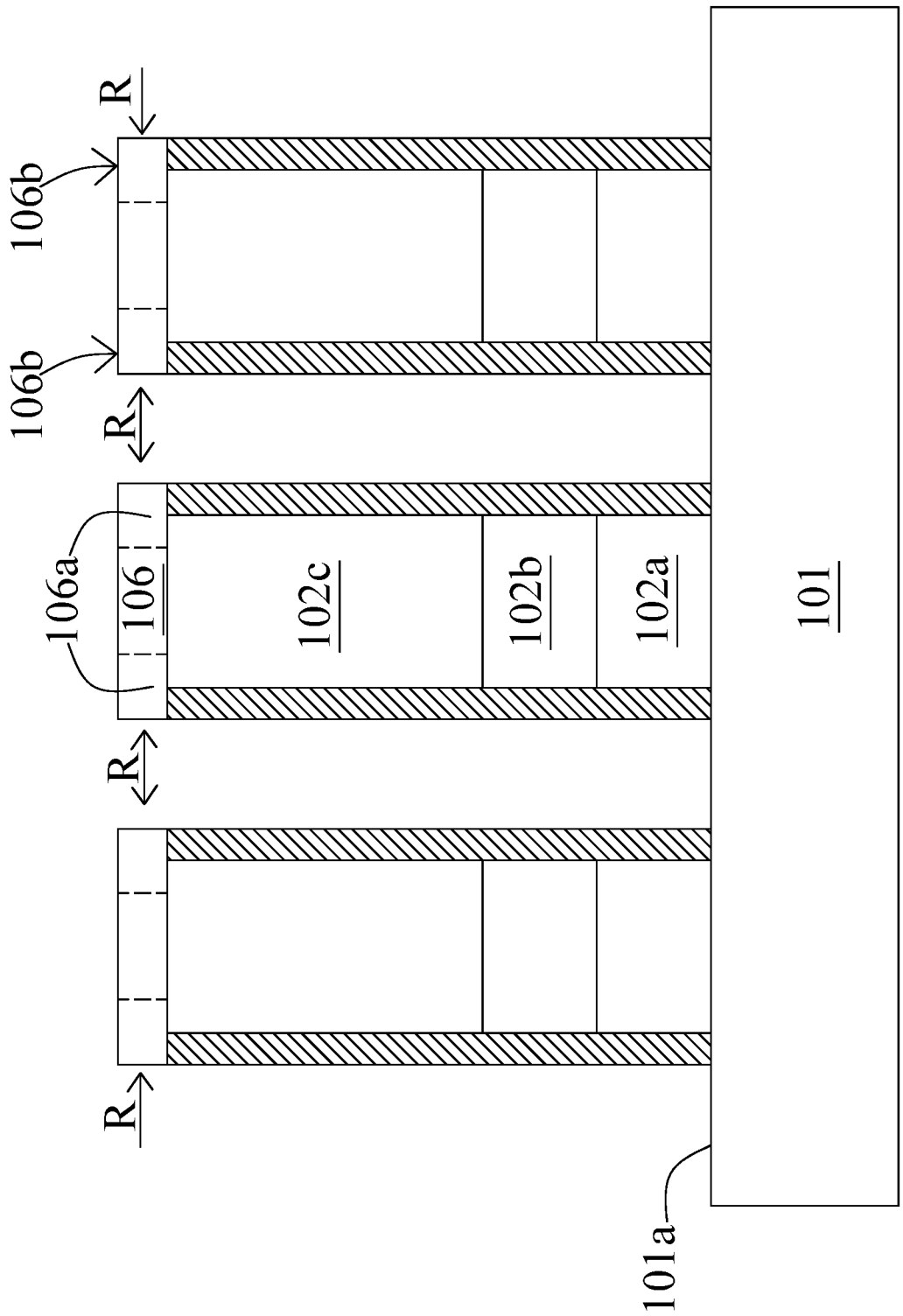

Referring to FIG. 23, a portion 106a of the energy-decomposable mask 106 is irradiated by an electromagnetic radiation R according to step S207 in FIG. 3. In some embodiments, the portion 106a of the energy-decomposable mask 106 irradiated by the electromagnetic radiation R is disposed at a periphery 106b of the energy-decomposable mask 106. In some embodiments, the portion 106a of the energy-decomposable mask 106 irradiated by the electromagnetic radiation is in contact with the spacer 102d and the second dielectric layer 102c.

In some embodiments, the electromagnetic radiation R irradiates the periphery 106b of the energy-decomposable mask 106 to treat the portion 106a of the energy-decomposable mask 106. As a result, the portion 106a of the energy-decomposable mask 106 becomes easily removable. In some embodiments, the electromagnetic radiation R is emitted laterally toward the portion 106a of the energy-decomposable mask 106. In some embodiments, the electromagnetic radiation R is infrared (IR), ultraviolet (UV), electron beam (e-beam) or the like.

Figure 24:
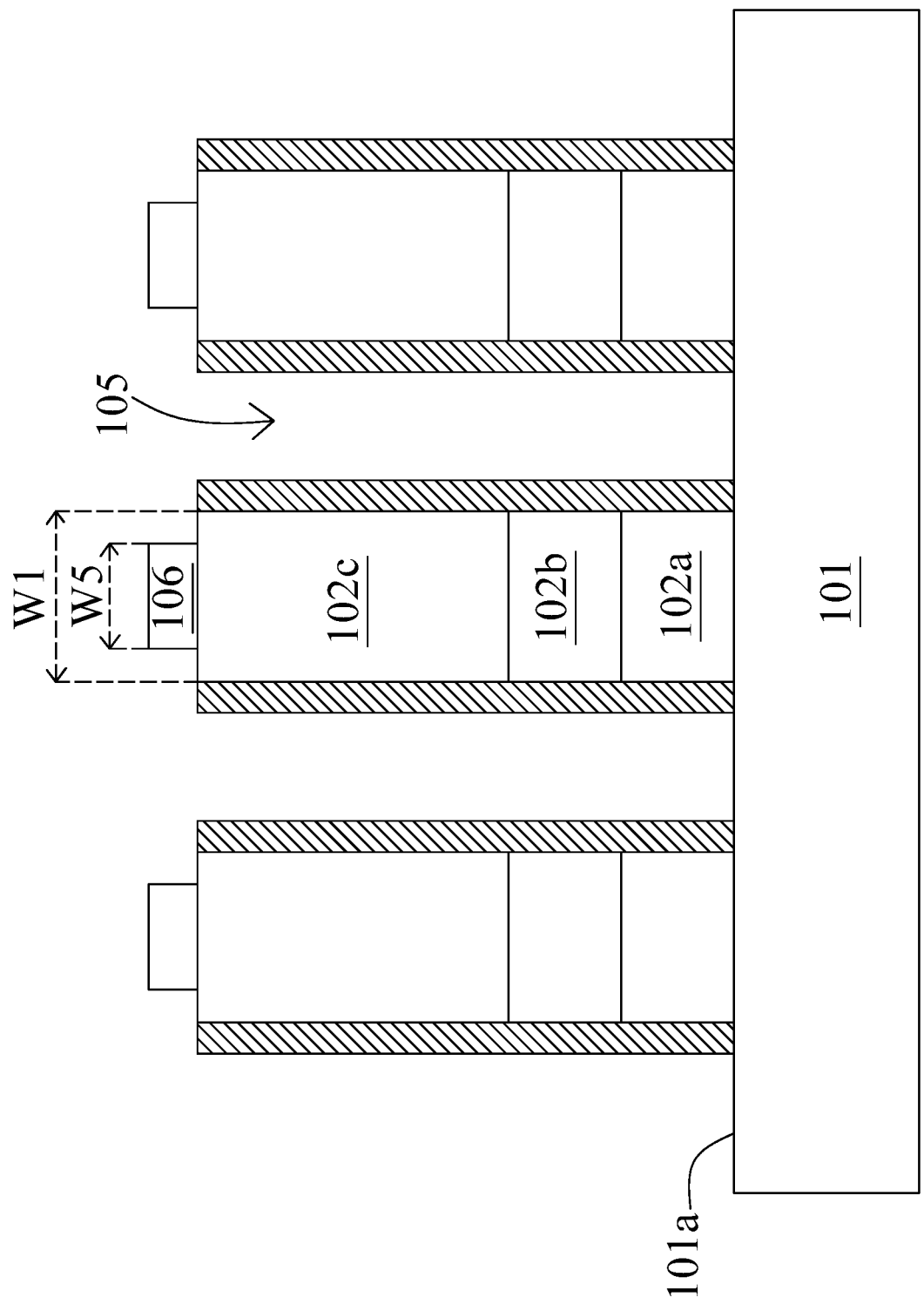

Referring to FIG. 24, the portion 106a of the energy-decomposable mask 106 irradiated by the electromagnetic radiation R is removed according to step S208 in FIG. 3. In some embodiments, the portion 106a of the energy-decomposable mask 106 is removed by etching or any other suitable process. After the removal of the portion 106a of the energy-decomposable mask 106, at least portions of the second dielectric layer 102c and the spacer 102d are exposed through the energy-decomposable mask 106. In some embodiments, a width W5 of the energy-decomposable mask 106 after the removal of the portion 106a of the energy-decomposable mask 106 irradiated by the electromagnetic radiation R is substantially less than a width W1 of the second dielectric layer 102c after the formation of the first trench 105.

Figure 25:
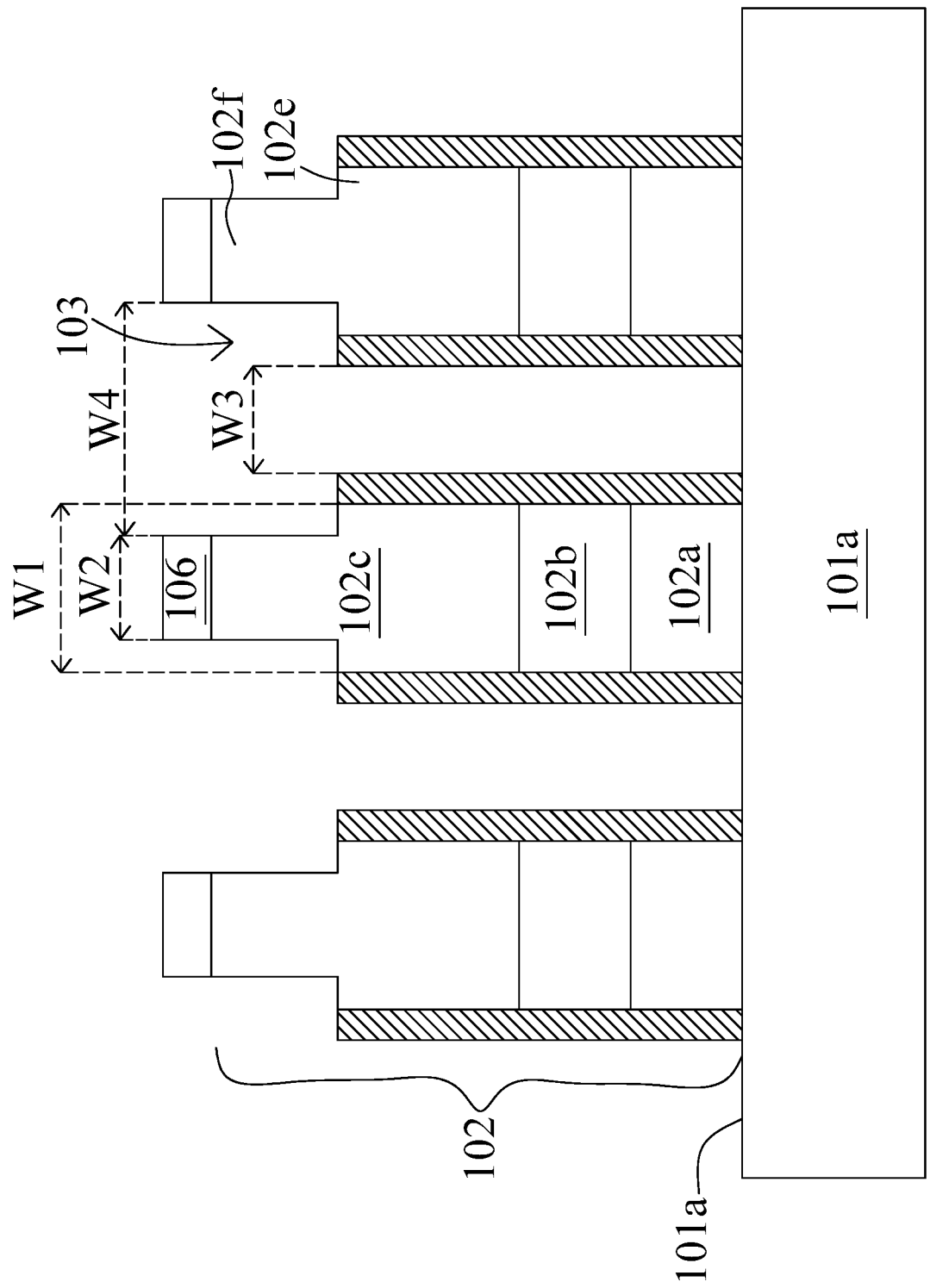

Referring to FIG. 25, a portion of the second dielectric layer 102c exposed through the energy-decomposable mask 106 is removed according to step 209 in FIG. 3. In some embodiments, the portion of the second dielectric layer 102c exposed through the energy-decomposable mask 106 is removed by etching or any other suitable process. After the removal of the portion of the second dielectric layer 102c exposed through the energy-decomposable mask 106, the second dielectric layer 102c includes a portion having a first width W1 and a portion having a second width W2 higher than the portion having the first width W1, wherein the second width W2 is substantially less than the first width W1. In some embodiments, the second dielectric layer 102c including a first portion 102e and a second portion 102f over the first portion 102e is formed.

In some embodiments, a portion of the spacer 102d exposed through the energy-decomposable mask 106 is removed as shown in FIG. 25. In some embodiments, the portion of the spacer 102d exposed through the energy-decomposable mask 106 is removed by etching or any other suitable process. After the removal of the portion of the spacer 102d exposed through the energy-decomposable mask 106, the second portion 102f of the second dielectric layer 102c is exposed through the spacer 102d. In some embodiments, the removal of the portion of the second dielectric layer 102c exposed through the energy-decomposable mask 106 and the removal of the portion of the spacer 102d exposed through the energy-decomposable mask 106 are performed separately or simultaneously.

After the removal of the portion of the second dielectric layer 102c exposed through the energy-decomposable mask 106 and the removal of the portion of the spacer 102d exposed through the energy-decomposable mask 106, a bit line 102 is formed and a gap 103 is formed between two adjacent bit lines 102. In some embodiments, a lower portion of the gap 103 has a third width W3, and a higher portion of the gap 103 has a fourth width W4 substantially greater than the third width W3.

Figure 26:
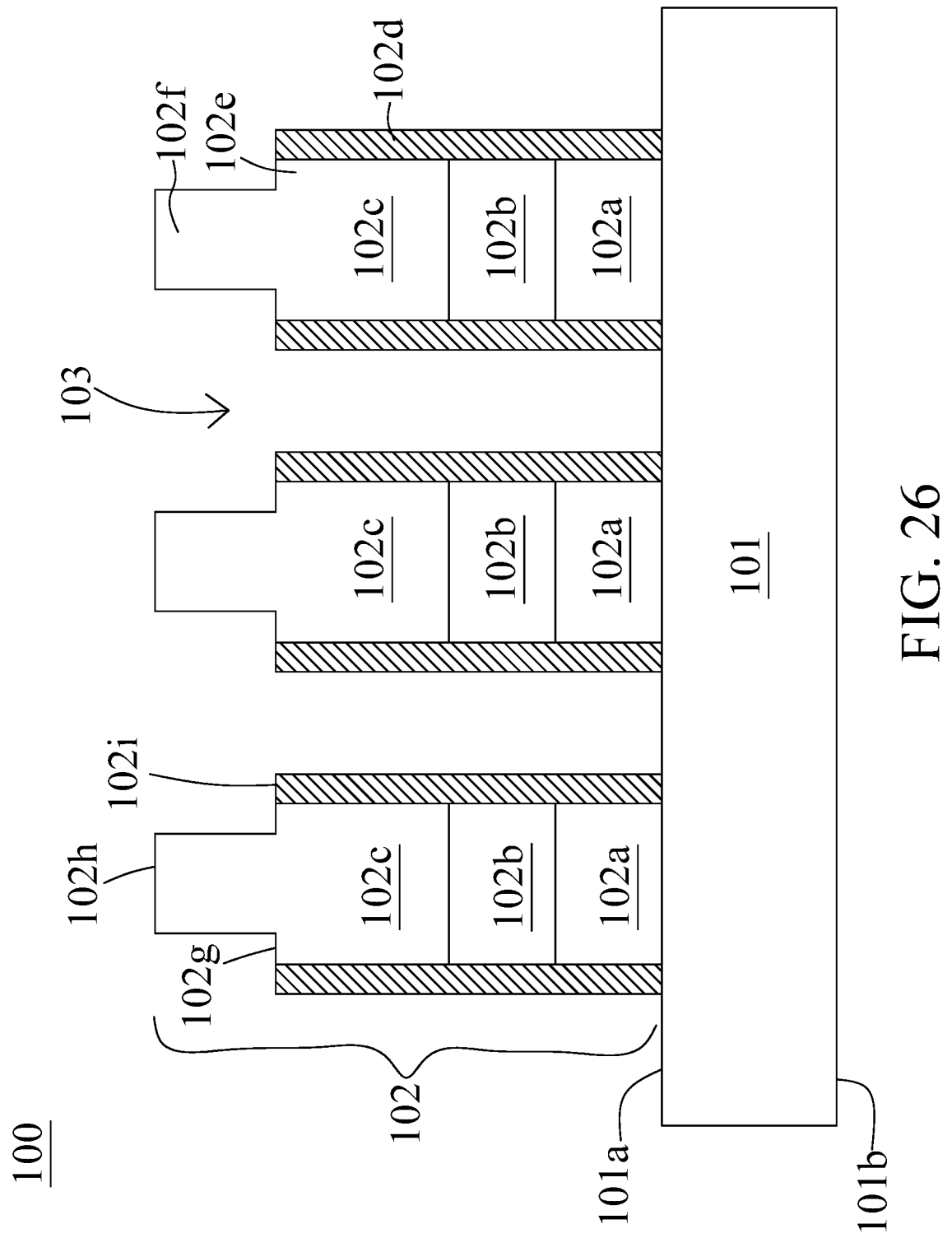

In some embodiments, after the formation of the gap 103, the energy-decomposable mask 106 over the second dielectric layer 102c is removed as shown in FIG. 26. In some embodiments, the energy-decomposable mask 106 is removed by etching or any other suitable process. In some embodiments, the memory device 100 of FIG. 1 is formed as shown in FIG. 26.

In an aspect of the present disclosure, a memory device is provided. The memory device includes a semiconductor substrate including a first surface; and a bit line disposed on the first surface of the semiconductor substrate, wherein the bit line includes a first dielectric layer, a conductive layer disposed over the first dielectric layer, a second dielectric layer disposed over the conductive layer, and a spacer surrounding the first dielectric layer, the conductive layer and the second dielectric layer, wherein the second dielectric layer includes a first portion surrounded by the spacer and a second portion disposed over the first portion and exposed through the spacer, wherein a first width of the first portion is substantially greater than a second width of the second portion.

In another aspect of the present disclosure, a memory device is provided. The memory device includes a semiconductor substrate including a first surface; a first bit line and a second bit line disposed on the first surface of the semiconductor substrate and adjacent to each other, wherein the first bit line and the second bit line respectively include a first dielectric layer, a conductive layer disposed over the first dielectric layer, a second dielectric layer disposed over the conductive layer, and a spacer surrounding the first dielectric layer, the conductive layer and the second dielectric layer; and a gap disposed between the first bit line and the second bit line, wherein the gap has a first width and a second width substantially different from the first width.

In another aspect of the present disclosure, a method of manufacturing a memory device is provided. The method includes steps of providing a semiconductor substrate having a first surface; disposing a first dielectric layer over the first surface of the semiconductor substrate, a conductive layer over the first dielectric layer, and a second dielectric layer over the conductive layer; disposing a patterned mask over the second dielectric layer; removing portions of the second dielectric layer, the conductive layer and the first dielectric layer exposed through the patterned mask to form a first trench; forming a spacer surrounding the first dielectric layer, the conductive layer and the second dielectric layer; disposing an energy-decomposable mask over the second dielectric layer and the spacer; irradiating a portion of the energy-decomposable mask by an electromagnetic radiation; removing the portion of the energy-decomposable mask irradiated by the electromagnetic radiation; and removing a portion of the second dielectric layer exposed through the energy-decomposable mask.

In conclusion, because a portion of a second dielectric layer of a bit line is removed to form a stepped profile, a distance or a critical dimension between two adjacent bit lines can be increased and bridging of two adjacent bit lines can be prevented. More specifically, because the bit line has the stepped profile around a periphery of the bit line, a subsequent filling of a gap between two adjacent bit lines with conductive or insulating material can be performed more efficiently. The gap between two adjacent bit lines can be filled completely without formation of voids or while minimizing the formation of voids. Therefore, performance of the memory device and a process of manufacturing the memory device are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:
    providing a semiconductor substrate having a first surface;
    disposing a first dielectric layer over the first surface of the semiconductor substrate, a conductive layer over the first dielectric layer, and a second dielectric layer over the conductive layer;
    disposing a patterned mask over the second dielectric layer;
    removing portions of the second dielectric layer, the conductive layer and the first dielectric layer exposed through the patterned mask to form a first trench;
    forming a spacer surrounding the first dielectric layer, the conductive layer and the second dielectric layer;
    disposing an energy-decomposable mask over the second dielectric layer and the spacer;
    irradiating a portion of the energy-decomposable mask by an electromagnetic radiation;
    removing the portion of the energy-decomposable mask irradiated by the electromagnetic radiation; and
    removing a portion of the second dielectric layer exposed through the energy-decomposable mask.

2. The method according to claim 1, further comprising removing a portion of the spacer exposed through the energy-decomposable mask.

3. The method according to claim 2, wherein at least a portion of the second dielectric layer is exposed through the spacer.

4. The method according to claim 2, wherein the removal of the portion of the second dielectric layer and the removal of the portion of the spacer are performed separately or simultaneously.

5. The method according to claim 1, wherein the energy-decomposable mask is thermally decomposable, photonically decomposable or electron-beam (e-beam) decomposable.

6. The method according to claim 1, wherein the energy-decomposable mask includes a cross-linking compound having a functional group or a double bonding.

7. The method according to claim 1, wherein the energy-decomposable mask includes polymer, polyimide, resin or epoxy.

8. The method according to claim 1, wherein the electromagnetic radiation is emitted laterally toward the portion of the energy-decomposable mask.

9. The method according to claim 1, wherein the electromagnetic radiation is infrared (IR), ultraviolet (UV) or electron beam (e-beam).

10. The method according to claim 1, wherein the first trench extends toward the first surface of the semiconductor substrate and is adjacent to the second dielectric layer, the conductive layer and the first dielectric layer.

11. The method according to claim 1, wherein the portion of the energy-decomposable mask irradiated by the electromagnetic radiation is disposed at a periphery of the energy-decomposable mask.

12. The method according to claim 1, wherein the portion of the energy-decomposable mask irradiated by the electromagnetic radiation is in contact with the spacer and the second dielectric layer.

13. The method according to claim 1, wherein a width of the energy-decomposable mask after the removal of the portion of the energy-decomposable mask irradiated by the electromagnetic radiation is substantially less than a width of the second dielectric layer after the formation of the first trench.

14. The method according to claim 1, wherein after the removal of the portion of the second dielectric layer exposed through the energy-decomposable mask, the second dielectric layer includes a first width and a second width over the first width and substantially less than the first width.

15. The method according to claim 1, further comprising removing the energy-decomposable mask over the second dielectric layer after the removal of the portion of the second dielectric layer exposed through the energy-decomposable mask.

16. A method of manufacturing a memory device, comprising:

providing a semiconductor substrate including a first surface;

forming a first bit line and a second bit line on the first surface of the semiconductor substrate and adjacent to each other, wherein the first bit line and the second bit line respectively include a first dielectric layer, a conductive layer disposed over the first dielectric layer, a second dielectric layer disposed over the conductive layer, and a spacer surrounding the first dielectric layer, the conductive layer and the second dielectric layer; and forming a gap disposed between the first bit line and the second bit line, wherein the gap has a first width and a second width substantially different from the first width.

17. The method according to claim 16, wherein the first width is substantially less than the second width.

18. The method according to claim 16, wherein the second width is disposed over the first width.

19. The method according to claim 16, wherein the gap is tapered toward the first surface of the semiconductor substrate.

* * * * *